United States Patent
Tanaka et al.

(10) Patent No.: US 10,251,282 B2
(45) Date of Patent: Apr. 2, 2019

(54) ELECTRONIC COMPONENT MOUNTING DEVICE

(71) Applicant: FUJI CORPORATION, Chiryu (JP)

(72) Inventors: Katsunori Tanaka, Kasugai (JP); Tsuyoshi Hamane, Toyota (JP); Noriaki Iwaki, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 341 days.

(21) Appl. No.: 15/030,324

(22) PCT Filed: Oct. 21, 2013

(86) PCT No.: PCT/JP2013/078467
§ 371 (c)(1),
(2) Date: Apr. 18, 2016

(87) PCT Pub. No.: WO2015/059747
PCT Pub. Date: Apr. 30, 2015

(65) Prior Publication Data
US 2016/0278217 A1    Sep. 22, 2016

(51) Int. Cl.
*B23K 3/06*    (2006.01)
*H05K 3/34*    (2006.01)

(52) U.S. Cl.
CPC ......... *H05K 3/3468* (2013.01); *B23K 3/0653* (2013.01)

(58) Field of Classification Search
CPC .. B23K 3/0653; B23K 1/085; B23K 2201/42; B23K 1/0016
USPC ....................................................... 228/260
See application file for complete search history.

(56) References Cited

U.S. PATENT DOCUMENTS

| | | | |
|---|---|---|---|
| 3,092,059 A | 6/1963 | Tesch, Jr. | |
| 5,203,489 A | 4/1993 | Gileta et al. | |
| 2011/0303737 A1* | 12/2011 | Mimura | B23K 3/0653 228/260 |

(Continued)

FOREIGN PATENT DOCUMENTS

| | | |
|---|---|---|
| JP | 6-13746 A | 1/1994 |
| JP | 6-53304 B2 | 7/1994 |

(Continued)

OTHER PUBLICATIONS

Extended European Search Report dated May 15, 2017 in Patent Application No. 13896017.4.

(Continued)

*Primary Examiner* — Erin B Saad
(74) *Attorney, Agent, or Firm* — Oblon, McClelland, Maier & Neustadt, L.L.P.

(57) ABSTRACT

Maintenance of a flow tank is facilitated. A sub-module is provided adjacent to a main module. A board is introduced in the sub-module, and is heated by a heater that is at a heating position, is moved to the main module, solder is applied by a flow tank in parallel with insertion of a component by a component insertion device, and thereby the component is mounted. If a maintenance condition is established, introduction of boards is stopped, the heater is moved to a standby position, and the flow tank is moved to a maintenance position of the sub-module. Maintenance is performed on the flow tank and since the component insertion device is not present above the flow tank, it is possible to facilitate inspection, removal, and the like of the flow tank.

10 Claims, 20 Drawing Sheets

(56) References Cited

U.S. PATENT DOCUMENTS

2015/0188247 A1* 7/2015 Sullaj ................ H01R 12/7082
439/66

FOREIGN PATENT DOCUMENTS

| | | |
|---|---|---|
| JP | 8-64941 A | 3/1996 |
| JP | 8-162750 A | 6/1996 |
| JP | 10-209622 A | 8/1998 |
| JP | 2003-188517 A | 7/2003 |
| JP | 5121954 B2 | 1/2013 |

OTHER PUBLICATIONS

International Search Report dated Dec. 17, 2013 in PCT/JP13/078467 Filed Oct. 21, 2013.

* cited by examiner

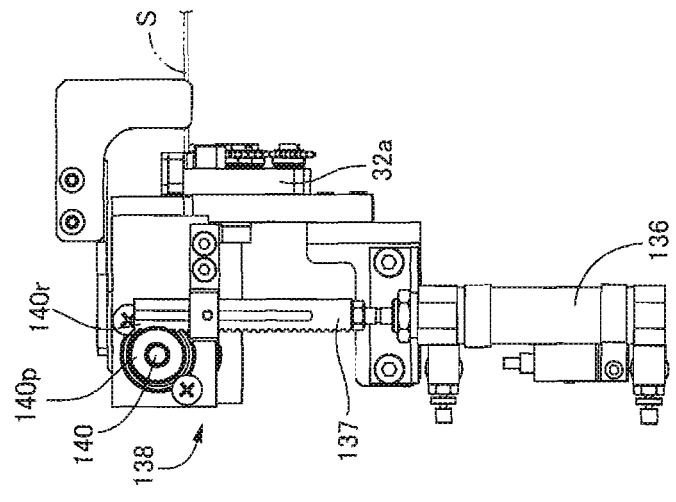
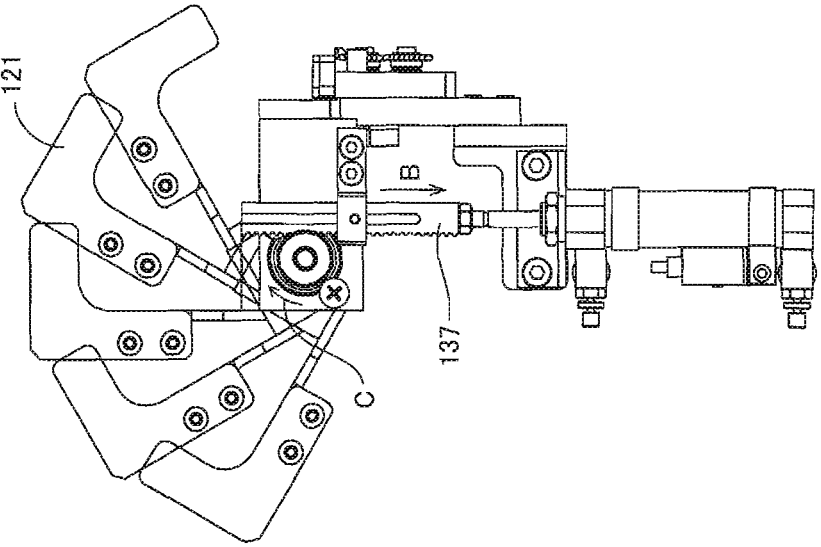
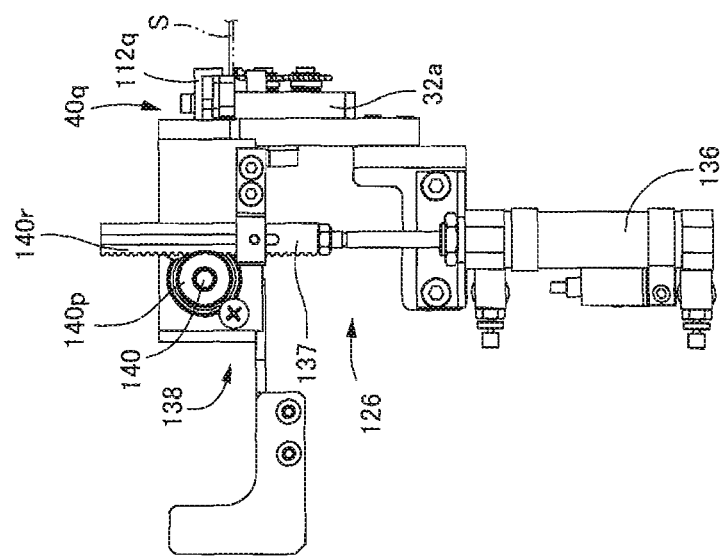

(a) Set state (b) Open state

FIG. 12A
FIG. 12B
FIG. 12C
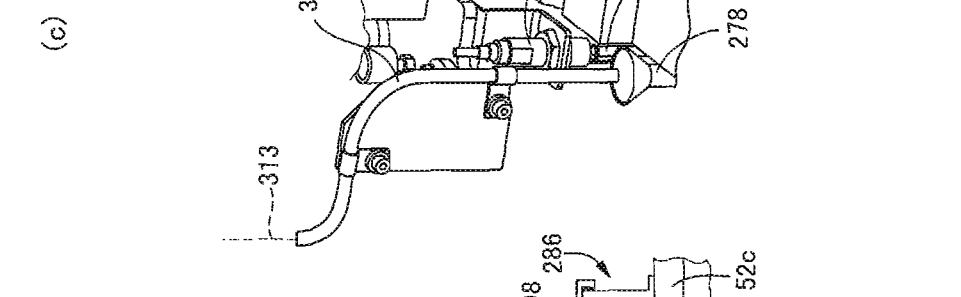
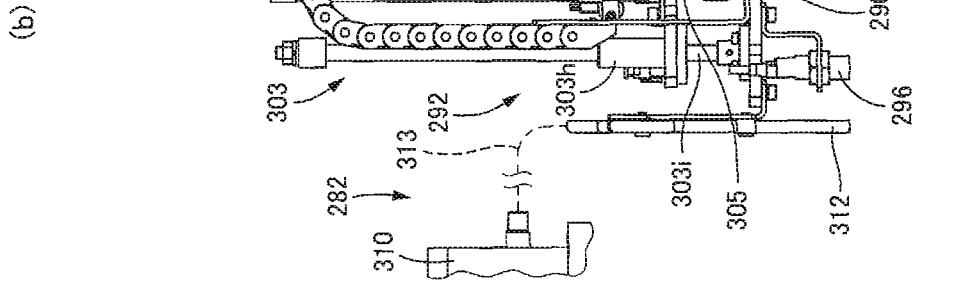
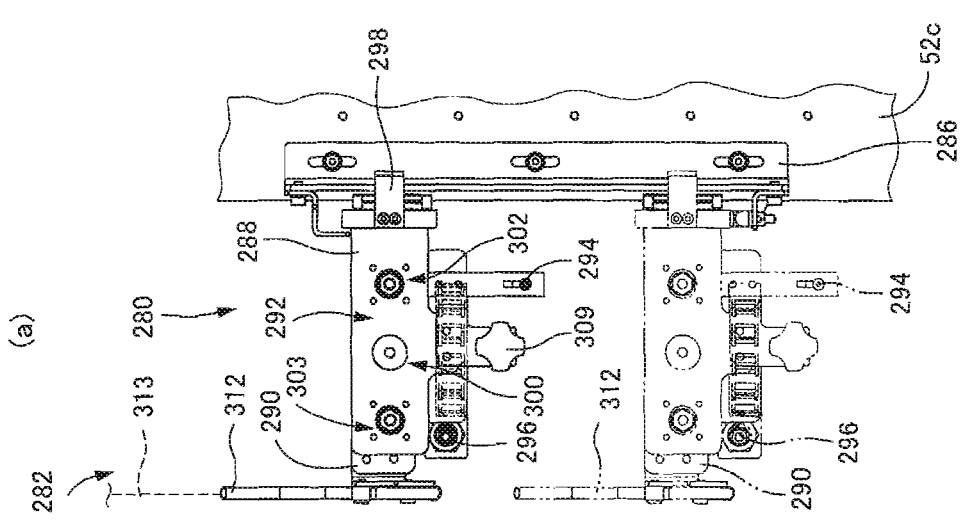

(a)

(b)

(a)

$h^* = hs - hf - h$ (b)

$$\gamma = \frac{\langle h_{k-1} - h_k \rangle}{\Delta x}$$

$h_{ref} = h_1 + \gamma \cdot x_{ref} = h$ (a) Propeller shaft is switched (b) Path within tank is switched (c) Nozzle is blocked and switched

ELECTRONIC COMPONENT MOUNTING DEVICE

TECHNICAL FIELD

The present disclosure relates to an electronic component mounting device for mounting an electronic component on a board using a viscous fluid.

BACKGROUND ART

A mounting device including (a) a component insertion head and (b) a solder tank that accommodates molten solder and ejects solder from a nozzle is described in PTL 1. In the mounting device, components are mounted on a printed board by a leaded component being inserted into the printed board, which is held by an xy table, from above by the component insertion head, and solder being supplied by the solder tank from below. The component insertion head is able to be moved in x, y, and z directions and the solder tank is able to be moved in the z direction.

Soldering devices including a fluxer, a pre-heater, and a solder tank are described in PTLs 2 and 3. In the soldering device, from below a printed board that is held by a pair of liftable rails, flux is coated by the fluxer, heating is performed by the pre-heater, and then solder is selectively applied by the solder tank. In the solder tank described in PTL 3, two nozzles having different diameters are provided and solder is simultaneously ejected from the two nozzles. In the soldering devices described in PTLs 2 and 3, the printed board is conveyed by a pusher on the pair of rails in the range in which coating of flux, heating, and the application of solder are performed.

In a mounting device described in PTL 4, solder is supplied by a dispenser from above to positions on a board at which electronic components are to be mounted and then the board is flipped. Then, the electronic components are inserted in the board from above, the solder is melted by a heat source from below, thus mounting the electronic components. The heat source is able to be moved in x and y directions.

CITATION LIST

Patent Literature

PTL 1: JP-A-10-209622
PTL 2: JP-A-08-162750
PTL 3: JP-A-2003-188517
PTL 4: JP-A-06-13746

BRIEF SUMMARY

An object of the present disclosure is improvement of an electronic component mounting device, more specifically, to facilitate maintenance of a flow tank accommodating a viscous fluid and to reduce the size of the apparatus.

Effects

In an electronic component mounting device according to the disclosure, a flow tank in which a viscous fluid is accommodated is able to be moved to a region outside a component mountable region. The region outside the component mountable region can be, for example, a region in which a component insertion device is not provided or a region in which component mounting on a board is not performed. As a result, maintenance is facilitated such as by making removal or inspection of the flow tank easy.

In addition, with the electronic component mounting device of the disclosure it is possible to provide a flow tank three-dimensional moving device that moves the flow tank in three directions orthogonal to each other. As a result, the size of the apparatus is reduced compared to a case where a board three-dimensional moving device that moves a printed circuit board in three directions orthogonal to each other is provided.

BRIEF DESCRIPTION OF DRAWINGS

FIG. 5 is a view illustrating an operation state of a shuttle arm of a shuttle device of the board conveyance device. FIG. 5A illustrates a standby state, FIG. 5B illustrates changed states, and FIG. 5C illustrates a standby state.

FIG. 11 is a view illustrating an operation of a flow tank mounting and dismounting device of the electronic component mounting device.

FIG. 12A is a plan view of an inspection unit of the electronic component mounting device. FIG. 12B is a front view of the inspection unit. FIG. 12C is a view illustrating an operation state of the inspection unit.

FIG. 16 illustrates an example of control by the control device.

FIG. 17 is a view conceptually illustrating a flow tank of an electronic component mounting device according to embodiment 2 of the disclosure.

DESCRIPTION OF EMBODIMENTS

An electronic component mounting device of an embodiment of the disclosure includes a so-called point-flow type solder applying device. A lead, a connection terminal, or the like (hereinafter, simply referred to as lead) of an electronic component is inserted from above a circuit board (hereinafter, simply referred to as a board) into a through-hole formed in the board so as to set the electronic component (hereinafter, sometimes referred to as a component); solder paste (hereinafter, simply referred to as solder) as a viscous fluid is applied in a point shape (spot shape) to a portion at which the lead or the like inserted into the board is positioned from a lower side of the board, thus mounting the electronic component.

Note that, for circuit boards, applying solder is performed after coating of flux and heating are performed; however, in the following examples, an electronic component mounting device which performs only heating and applying of solder will be described.

Embodiment 1

<Outline of Electronic Component Mounting Device>

Figure 1:
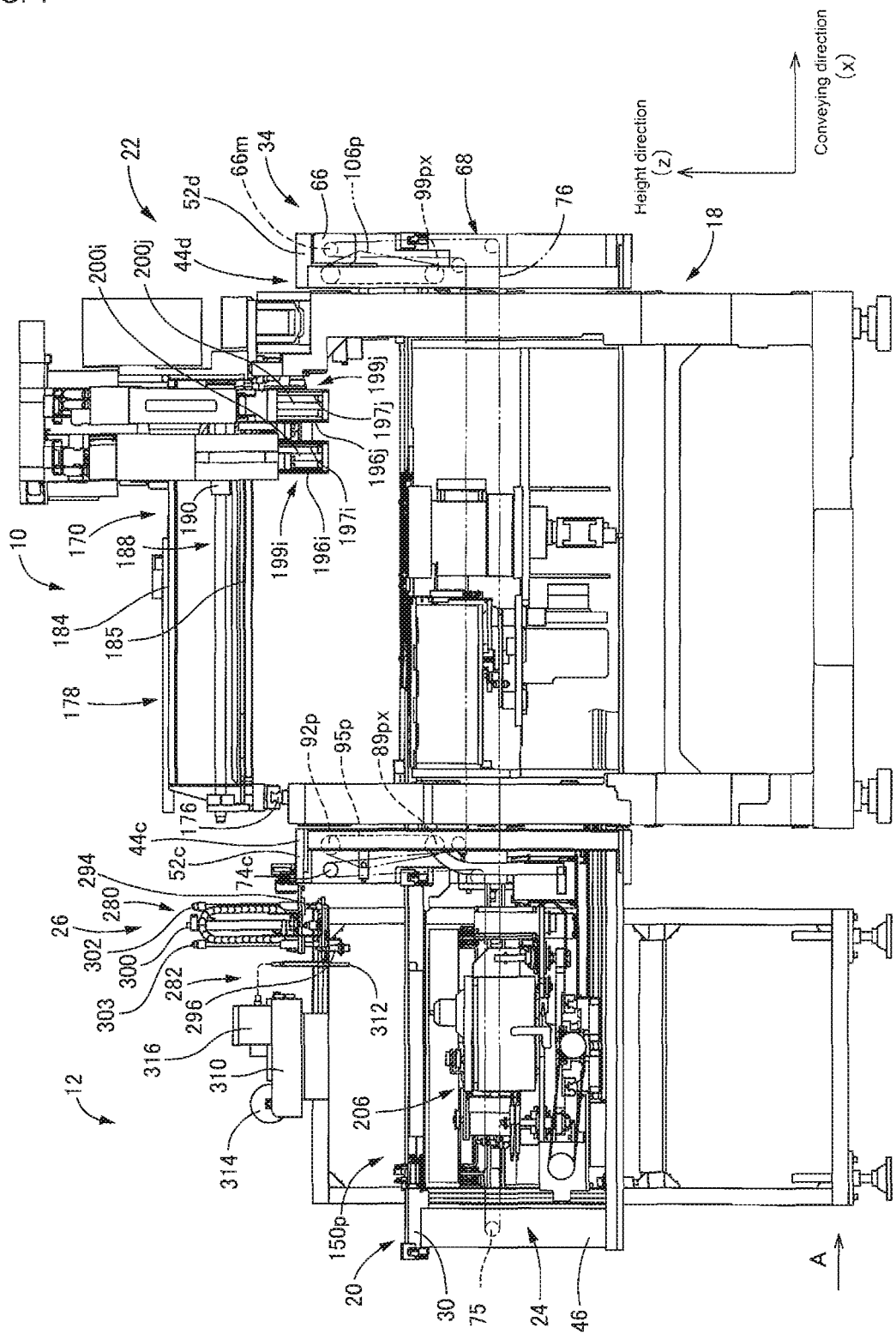
FIG. 1 is a front view of an electronic component mounting device according to embodiment 1 of the disclosure.
Figure 2:
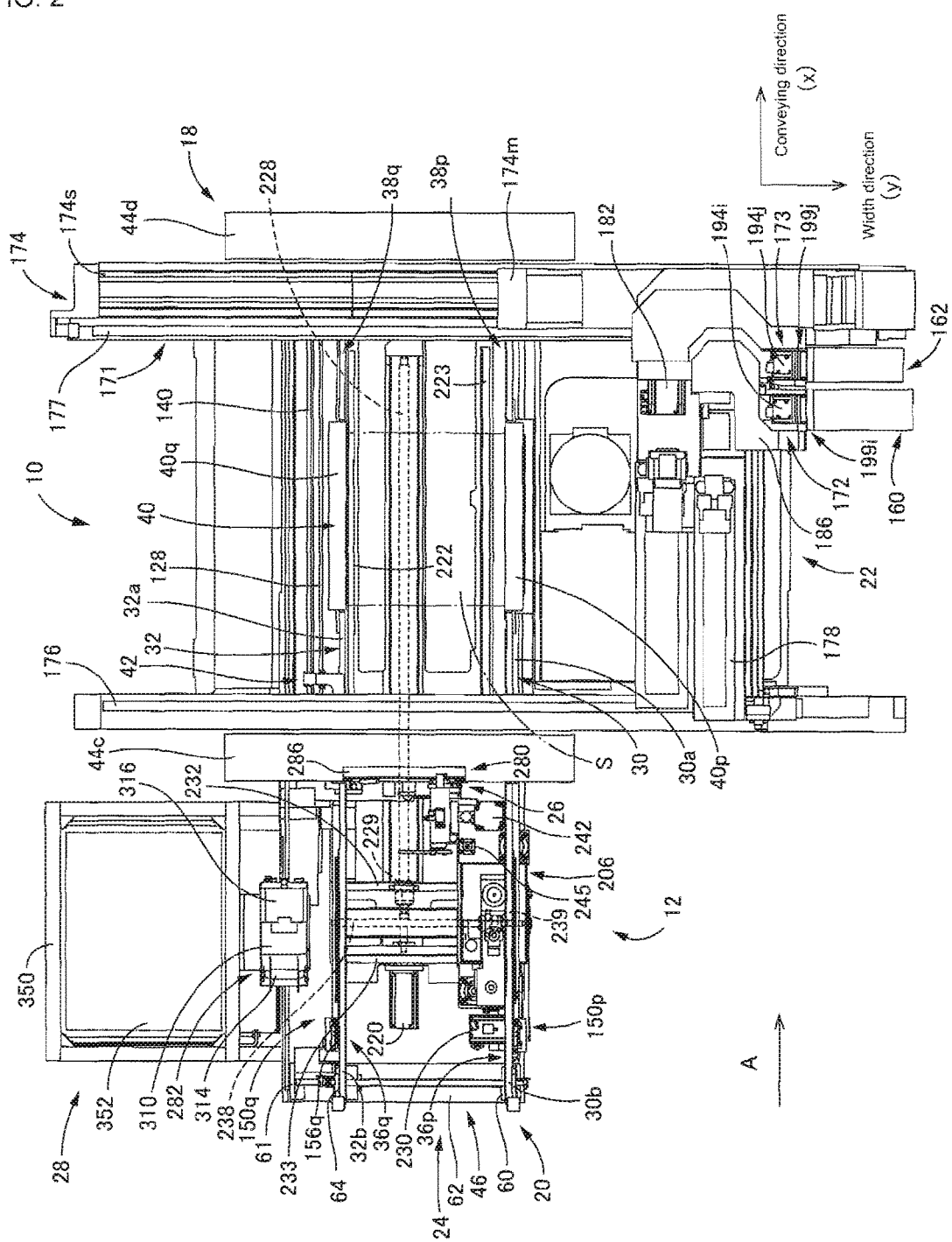
FIG. 2 is a plan view of the electronic component mounting device.

As illustrated in FIGS. 1 and 2, the electronic component mounting device according to this embodiment includes two modules 10 and 12. Mounting of components on board S is performed in module 10; heating board S, maintenance work, and so on, is performed in module 12. Thus, module 10 may be referred to as a component mounting section or a main module, and module 12 may be referred to as a heating section, a maintenance section, or a sub module. In addition, in the electronic component mounting device, sub module 12 is connected to the left side when viewed from a front of main module 10 and the conveying direction of board S is the direction of arrow A. Hereinafter, the conveying direction of board S is referred to as x, a width direction of board S is referred to as y, a thickness direction (height direction of the component mounting device) of board S is referred to as z. The x, y, and z directions are orthogonal to each other.

Figure 3:
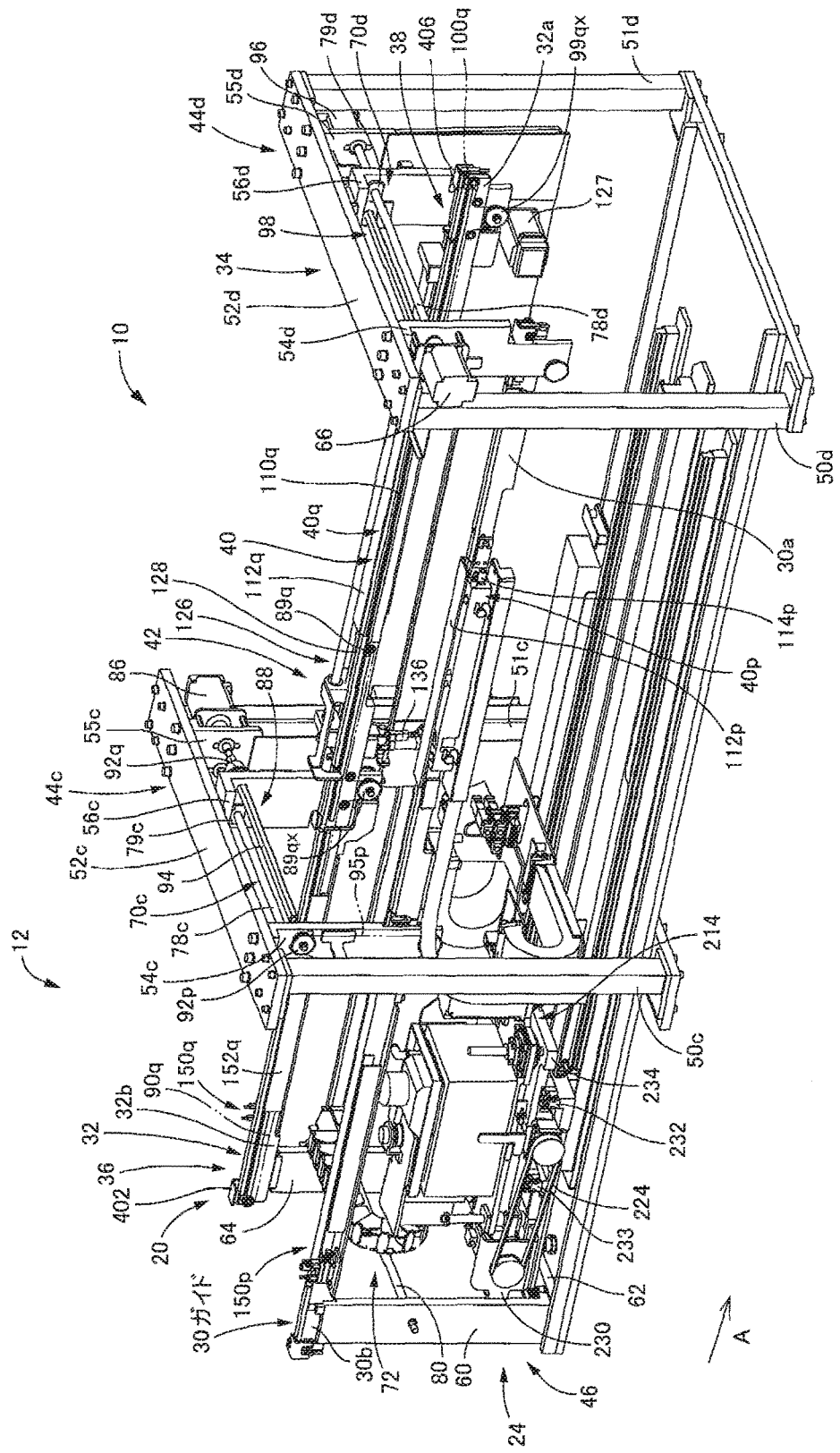
FIG. 3 is a perspective view of a main portion of the electronic component mounting device.

As illustrated in FIGS. 1 to 3, the electronic component mounting device includes (a) frame 18, (b) board conveyance device 20 that conveys board S, (c) component insertion device 22 that inserts a component into board S, (d) solder applying device 24 that applies solder to board S by ejecting solder, (e) maintenance device 26, (f) board preheating device 28 that preliminarily heats board S, and the like. Frames 18a to c (see FIG. 9) are added by connecting the sub-module 12 to the main module 10. Support strength of the sub-module 12 is increased by the frame 18c.

<Board Conveyance Device>

The board conveyance device 20 includes (a) a pair of guides 30 and 32 that are provided extending in the x direction and separated from each other in the y direction and, (b) width changing device 34 that changes the gap (gap in the y direction) between the pair of guides 30 and 32, (c) in-conveyor device 36, (d) out-conveyor device 38, (e) board holding device 40 which is provided between in-conveyor device 36 and out-conveyor device 38, (f) shuttle device 42 that moves board S at least between in-conveyor device 36 and board holding device 40, and between board holding device 40 and out-conveyor device 38, and the like.

Guides

Guides 30 and 32 include main guides 30a and 32a belonging to the main module 10, and sub guides 30b and 32b belonging to the sub-module 12. Main guides 30a and 32a are held by being suspended by portal frames 44c and d, which are spaced apart in the x direction, as frame 18. Sub guides 30b and 32b are held by groove-shaped frame 46 and portal frame 44c, which are spaced apart in the x direction, as the frame 18.

As illustrated in FIG. 3, portal frame 44c includes a pair of columns 50c and 51c that are provided separated from each other in the y direction, and upper bar 52c that connects columns 50c and 51c in the y direction at an upper end portion; two fixed frames 54c and 55c, and one movable frame 56c are attached to upper bar 52c. Movable frame 56c is engaged with y-axis guide 58c (see FIG. 4) formed in the upper bar 52c and is movable between fixed frames 54c and 55c in the y direction. Similarly, portal frame 44d includes columns 50d and 51d, upper bar 52d, fixed frames 54d and 55d, movable frame 56d that is engaged with y-axis guide 58d, and the like.

Groove-shaped frame 46 includes (i) a pair of fixed frames 60 and 61 that are provided separated from each other in the y direction, (ii) lower bar 62 that connects fixed frames 60 and 61 in the y direction at a lower end portion, and (iii) movable frame 64 that is engaged with y-axis guide 63 (see FIG. 4) formed in lower bar 62, and is relatively movable in the y direction.

Main guide 30a is held in fixed frames 54c and d at both end portions and main guide 32a is held by movable frames 56c and d at both end portions. In addition, sub guide 30b is held by fixed frame 60 and fixed frame 54c at both end portions, and sub guide 32b is held by movable frame 64 and movable frame 56c at both end portions. As described above, sub guides 30b and 32b are connected to main guides 30a and 32a in the fixed frame 54c and the movable frame 56c of the portal frame 44c; thus, the pair of guides 30 and 32 are extended. Moreover, guide 30 may be referred to as the fixed guide and guide 32 may be referred to as the movable guide.

Width Changing Device

As illustrated in FIGS. 1 to 4, width changing device 34 changes a gap (width in the y direction) between the pair of guides 30 and 32 and, for example, may include (i) width changing motor 66 as a width changing driving source provided in fixed frame 54d of portal frame 44d, (ii) driving force transmitting section 68 that transmits a rotational driving force of width changing motor 66 to portal frame 44c and groove-shaped frame 46, (iii) motion conversion mechanisms 70c, d, and 72 that move the movable frames 56c, d, and 64 by converting rotary motion into linear motion in each of the portal frames 44c and d, and the groove-shaped frame 46, and the like.

Driving force transmitting section 68 includes driving pulleys 74c and 75 that are provided on fixed frame 54c of portal frame 44c, and fixed frame 60 of groove-shaped frame 46, and belt 76 that is stretched between output shaft 66m of width changing motor 66 and multiple pulleys including driving pulleys 74c and 75. Motion conversion mechanisms 70c, d, and 72 can be a screw mechanism including output shaft 66m of width changing motor 66, screw rods 78d, c, and 80 that are rotated with the rotation of driving pulleys 74c and e, and nut sections 79c, d, and 81 that are provided in movable frames 56c, d, and 64 to be not relatively rotatable and not relatively movable, and are screwed on screw rods 78c, d, and 80 (see FIG. 4). In width changing device 34, when width changing motor 66 is rotated, the rotation is transmitted to driving pulleys 74c and 75 by driving force transmitting section 68, driving pulleys 74c and are synchronized respectively via motion conversion mechanisms 70c, d, and 72, and movable frames 56c, d, and 64 are relatively moved with respect to fixed frames 54c, d, and 60.

In-Conveyor Device

As illustrated in FIGS. 1 to 4, in-conveyor device 36 is provided over a portion of sub guides 30b and 32b, and main guides 30a and 32a, and conveys board S carried in sub module 12 to a component mounting standby position.

Figure 4:
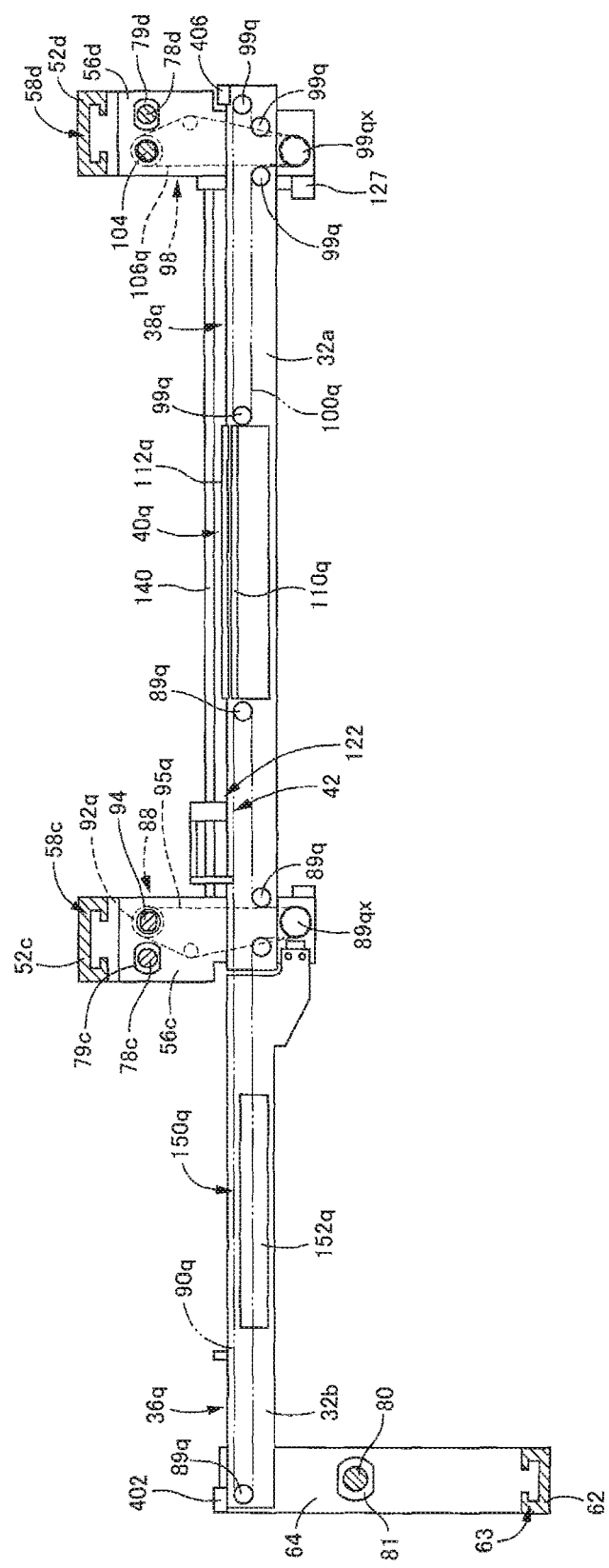
FIG. 4 is a view (front view) conceptually illustrating a portion of a board conveyance device of the electronic component mounting device.

In-conveyor device 36 can include, for example, (i) in-conveyors 36p and q that are respectively provided in fixed-side guides (a portion of sub guide 30b and main guide 30a) and movable-side guides (a portion of sub-guide 32b and main guide 32a), (ii) in-motor 86 as an in driving source, provided in fixed frame 55c of portal frame 44c, (iii) driving force transmitting section 88 that transmits a driving force of in-motor 86 to in-conveyors 36p and q, and the like. In-conveyors 36p and q respectively include multiple pulleys 89p and q, and chains 90p and q (pulley 89q and chain 90q provided on the movable side are illustrated in FIG. 4) that are wound around the multiple pulleys 89p and q along the chain guide. Driving force transmitting section 88 includes an output shaft of in-motor 86, drive transmitting rod 94 that integrally and rotatably connects driving pulleys 92p and q provided corresponding to fixed frame 54c and movable frame 56c by passing through fixed frame 54c and movable frame 56c, and drive transmitting chains 95p and q that transmit rotation of driving pulleys 92p and q to one (pulleys 89px and qx) of the multiple pulleys 89p and q. In the in-conveyor device 36, when in-motor 86 is rotated, the rotation is transmitted to in-conveyors 36p and q by driving force transmitting section 88, the pair of the chains 90p and q are synchronized and moved, and then board S on chains 90p and q is conveyed. In in-conveyor device 36, since a belt is not used, but chains 90p, q, 95p, and q are used, it is possible to improve heat resistance. In addition, if guides 30 and 32 are not formed of aluminum or steel, but stainless steel, it is possible to further improve the heat resistance and to reduce degradation.

Out-Conveyor Device

As illustrated in FIGS. 1 to 4, out-conveyor device 38 is provided on a portion of main guides 30a and 32a, and conveys board S on which components have been mounted from the electronic component mounting device.

Out-conveyor device 38 has the same configuration as that of in-conveyor device 36 and includes (i) out-conveyors 38p and q that are respectively provided in fixed-side guides (a portion of main guide 30a) and movable-side guides (a portion of main guide 32a), (ii) an out-motor 96 that is provided on fixed frame 55d of portal frame 44d, (iii) driving force transmitting section 98 that transmits a driving force of out-motor 96 to out-conveyors 38p and q, and the like. Out-conveyors 38p and q respectively include multiple pulleys 99p and q, and chains 100p and q (pulleys 99q and chain 100q provided on the movable side are illustrated in FIG. 4). Driving force transmitting section 98 includes drive transmitting rod 104 and drive transmitting chains 106p and q.

In board conveyance device 20 of the embodiment, screw rods 78c and d, and drive transmitting rods 94 and 104 are provided in an upper portion of portions of fixed frames 54c and d, and movable frames 56c and d, to which guides 30 and 32 are attached, in a posture extending in the y direction.

If one imagines that screw rods 78c and d, and drive transmitting rods 94 and 104 are provided in a lower portion of the portion to which guides 30 and 32 are attached, as described below, interference with the movement of the flow tank occurs. Thus, those members are provided in positions of the upper portion of the portion to which guides 30 and 32 are attached, which do not interfere with components mounted on board S that is conveyed along guides 30 and 32. In addition, as described in embodiments 3 and 4, portal frames 44c and 44d are provided on both sides of main module 10 in the x direction and thereby sub module 12 can be connected to any side of main module 10 in the x direction.

Board Holding Device

Board holding device 40 is provided between in-conveyor device 36 and out-conveyor device 38 in the conveying direction of board S, and has a clamping mechanism that clamps board S.

As illustrated in FIGS. 3 to 5, board holding device 40 can include board holding sections 40p and q that are provided in main guides 30a and 32a respectively extending in the x direction. Board holding sections 40p and q respectively can include, for example, (i) rails 110p and q (rail 110q is illustrated in FIG. 4) that hold board S from below, (ii) clampers 112p and q that press board S from above, (iii) clamper driving sections 114p and q, and the like. Clamp cylinders 114p and q as clamper driving sections 114p and q are operated by the turning on and off of electromagnetic valve solenoids 116p and q (see FIG. 14), and are switched between a clamp release position in which clampers 112p and q are separated from board S and a clamping position in which clampers 112p and q abut board S and grip board S with rails 110p and q in an upward and downward direction.

Shuttle Device

Figure 6:
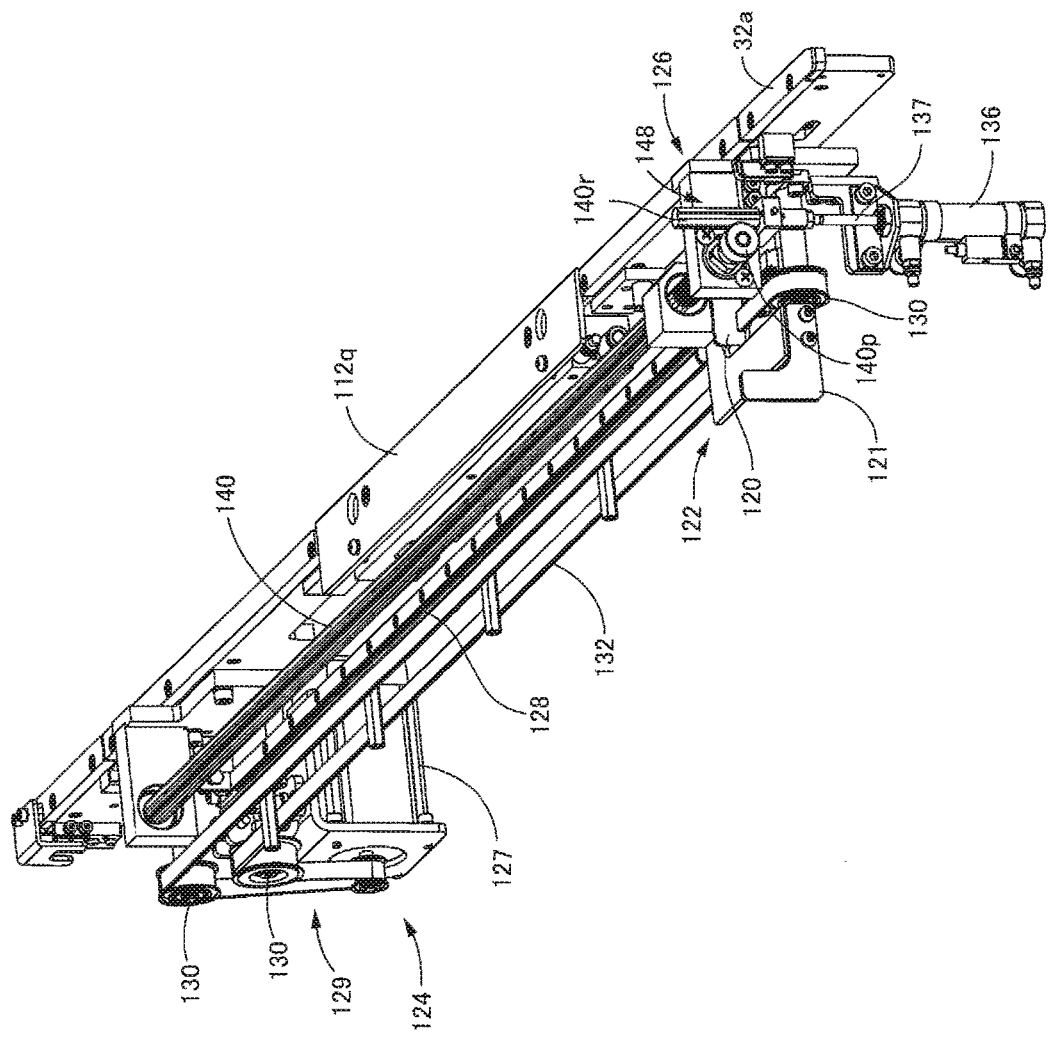
FIG. 6 is a perspective view of the shuttle device.

As illustrated in FIGS. 5 and 6, shuttle device 42 is provided on main guide 32a and moves board S in the x direction while pressing board S from the rear side.

Shuttle device 42 can include, for example, (i) shuttle 122 that includes shuttle body 120 and arm member 121 that is relatively rotatable with respect to shuttle body 120, (ii) shuttle moving device 124 that moves shuttle 122 in the x direction, (iii) arm rotating device 126 that rotates arm member 121 with respect to shuttle body 120, and the like. Shuttle moving device 124 includes (iv) shuttle motor 127 as a driving source, (v) shuttle guide 128 that extends parallel to the guide 32a, (vi) rotation transmitting section 129 that transmits rotation of shuttle motor 127 to shuttle 122, and the like. Rotation transmitting section 129 is a belt conveyor and includes multiple pulleys 130 that are rotatably provided on guide 32a and belt 132 that is wound around an output shaft of shuttle motor 127 and the multiple pulleys 130; shuttle body 120 is held so as to not be relatively movable with respect to belt 132 and is engaged with shuttle guide 128. Shuttle motor 127 is able to be rotated in both forward and rearward directions, and shuttle 122 moves back and forth by rotation of shuttle motor 127 via rotation transmitting section 129.

Arm rotating device 126 includes arm rotating cylinder 136 as an arm rotation driving source, motion conversion mechanism 138 that outputs rotary motion to arm member 121 by converting linear motion of movable member 137 of arm rotating cylinder 136 into rotary motion in the z direction, and the like. Motion conversion mechanism 138 is a rack-and-pinion mechanism, and includes (a) spline shaft 140 that is separated from guide 32a in the y direction and extends parallel to guide 32a on the upper side in the z direction, (b) pinion 140p that is integrally rotatable with spline shaft 140, (c) rack 140r that is provided on the movable member 137, and the like; arm member 121 is relatively movable in the x direction and integrally rotatably engaged with spline shaft 140. In arm rotating cylinder 136, when electromagnetic valve solenoid 144 (see FIG. 14) is turned off, as illustrated in FIG. 5(a), movable member 137 is in a protruding end position and arm member 121 is in a standby position separated from board S. When solenoid 144 is turned on, as illustrated in FIG. 5(b), movable member 137 is retracted (moved in the direction of arrow B) and pinion 140p, that is, spline shaft 140 is rotated (in the direction of arrow C). Arm member 121 is rotated and, as illustrated in FIG. 5(c), is in a conveying position at which engagement is possible with board S.

Board Moving Suppression Device

Figure 7A:
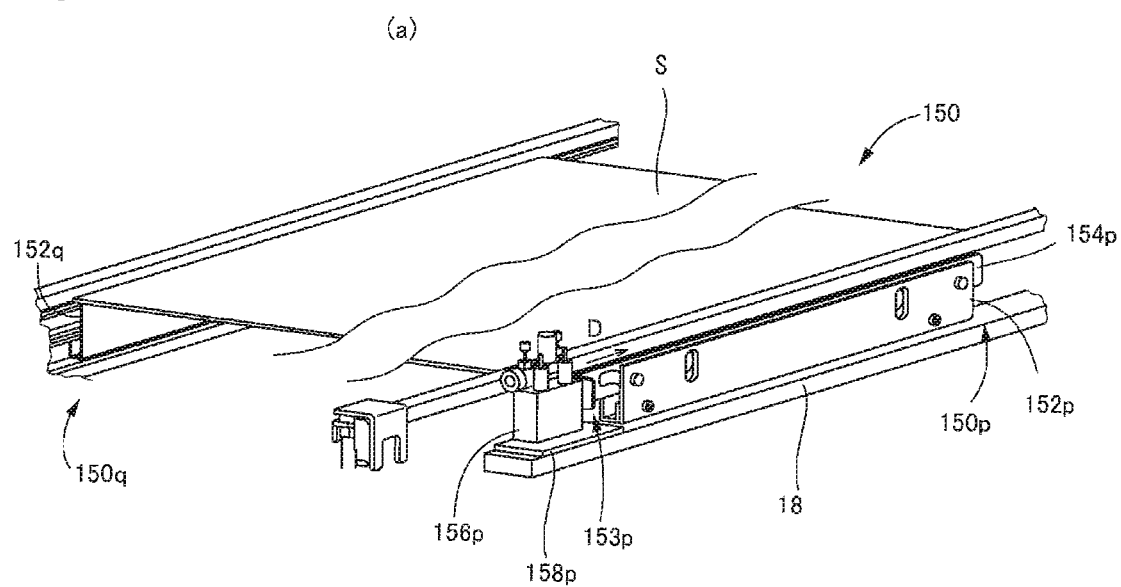
FIG. 7A is a perspective view of a board moving suppression section of the board conveyance device.
Figure 7B:
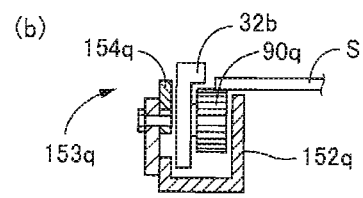
FIG. 7B is a sectional view of the board moving suppression section.

As illustrated in FIGS. 3 and 7, in-conveyor device 36 has board moving suppression device 150. Board moving suppression device 150 is provided to prevent moving of board S, even if in-motor 86 is operating. Board moving suppression device 150 includes board moving suppression sections 150p and q that are provided on each of sub-guides 30b and 32b extending in the x direction. As illustrated in FIGS. 7(a) and 7(b), board moving suppression sections 150p and q can include, for example, lift-up plates 152p and q that are provided parallel to sub-guides 30b and 32b, and lift-up plate driving sections 153p and q. Lift-up plate driving sections 153p and q include respectively air cylinders 156p and q as a driving source, and driving plates 154p and q that are connected to movable members of air cylinders 156p and q. Driving plates 154p and q are engaged with lift-up plates 152p and q in a state where the lift-up plates 152p and q are moved in the z direction in accordance with moving of the driving plates 154p and q in the x direction. If driving plates 154p and q are moved in the direction of arrow D of FIG. 7(a) by operation of air cylinders 156p and q (see FIG. 2), lift-up plates 152p and q are moved upward. Lift-up plates 152p and q abut board S on the inside of chains 90p and q, and board S is lifted and separated from chains 90p and q. Moreover, air cylinders 156p and q are attached to frame 18 via heat shield plates 158p and q. Thus, heat of frame 18 is unlikely to transmit to air cylinders 156p and q.

<Component Insertion Device>

Figure 8:
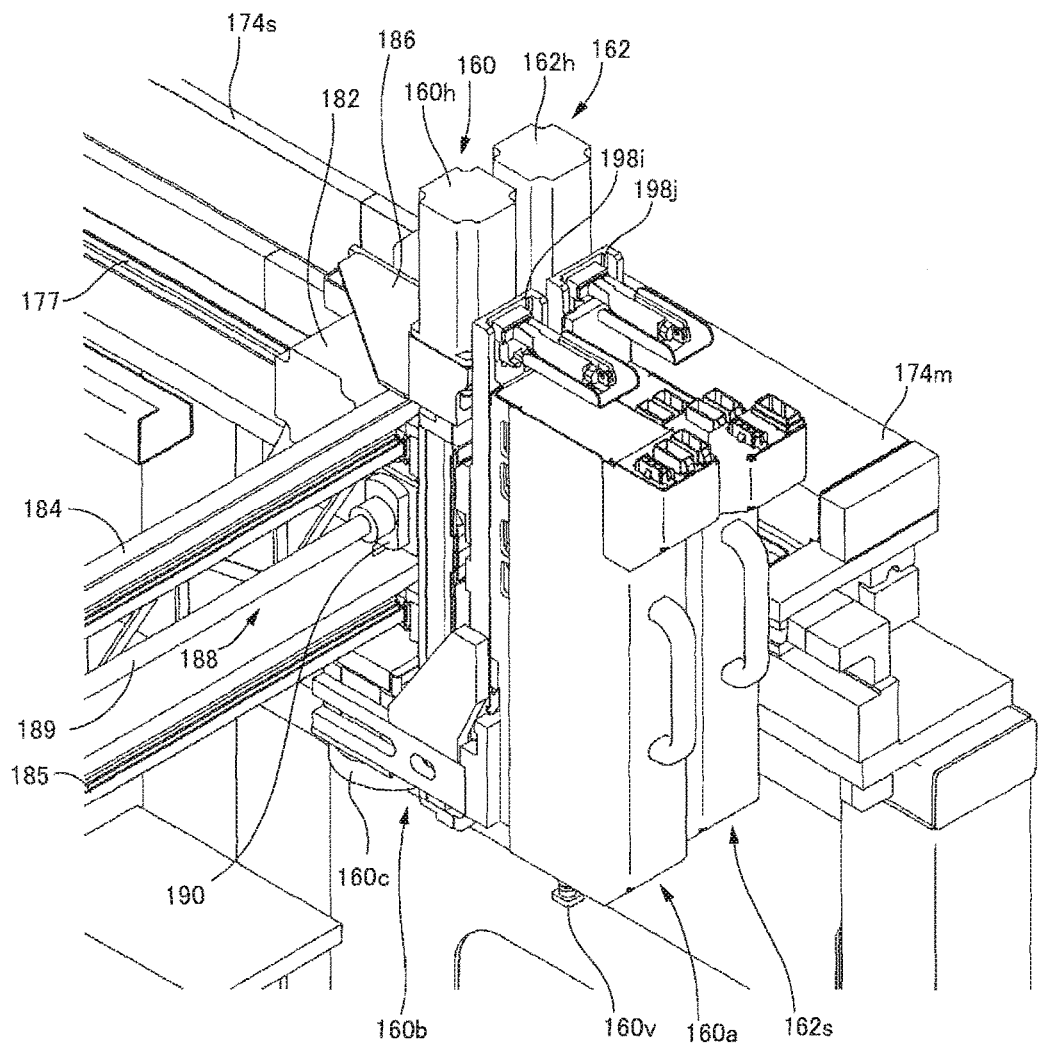
FIG. 8 is a perspective view (a portion) of a component insertion device of the electronic component mounting device.

The component insertion device 22 is provided in the main module (component mounting section) 10 and, as illustrated in FIGS. 1, 2, and 8, includes (a) first and second work units 160 and 162, and (b) x-axis moving device 170 that moves work units 160 and 162 in the x direction, and y-axis moving device 171 that moves work units 160 and 162 in the y direction. X-axis moving device 170 and y-axis moving device 171 integrally move work units 160 and 162.

Work Units

As illustrated in FIG. 8, first work unit 160 has component insertion head 160a on which component suction nozzle 160v is provided and imaging head 160b on which head camera 160c is provided. The second work unit 162 has detection head 162s on which height sensor 162r (see FIG. 14) is provided. Component suction nozzle 160v holds (for example, suctions) a component supplied from an external device, carries the component to a position on board S (hereinafter, referred to as a component insertion target point), at which a through-hole corresponding to the component is formed, and inserts the component into the through-hole. Head camera 160c is provided to image board S and the like; height sensor 162r is provided, for example, to irradiate measurement portions with a laser light with a high frequency and to detect a distance between the measurement portions by using reflected light. In addition, the first work unit 160 includes z-axis moving device 172 that moves component insertion head 160a and imaging head 160b with respect to body 160h of the work unit in the z axis direction; the second work unit 162 includes z-axis moving device 173 that moves detection head 162s with respect to body 162h in the z axis direction. Z-axis moving devices 172 and 173 are respectively provided in bodies 160h and 162h of the first and second work units.

Moving Device

Y-axis moving device 171 can include, for example, (a) linear motor 174 that is a y-axis motor as a driving source, (b) a pair of y-axis guides 176 and 177 that are separated in the x direction and extend in the y direction, and (c) y-axis slider 178 that is engaged with the pair of y-axis guides 176 and 177. Y-axis motor 174 includes stator 174s in which one of a magnet and coils is provided in parallel in the y direction, and mover 174m that includes the other of the magnet and the coils and is relatively movable with respect to stator 174s in the y direction. Y-axis slider 178 has a shape to extend in the x direction and holds mover 174m.

X-axis moving device 170 is provided on y-axis slider 178 and includes, for example, (a) x-axis motor 182 as a driving source, (b) a pair of x-axis guides 184 and 185 that extend in the x direction parallel to each other and separated in the z direction, (c) x-axis slider 186 that is engaged with the pair of x-axis guides 184 and 185, and (d) driving force transmitting section 188 that transmits linear motion to x-axis slider 186 by converting rotation of x-axis motor 182 into linear motion. Driving force transmitting section 188 includes screw rod 189 that is rotated in accordance with the rotation of x-axis motor 182 and a screw mechanism that has nut 190 fitting to screw rod 189, and x-axis slider 186 is held on the nut 190 to be not relatively rotatable and to be not relatively movable.

As described above, x-axis slider 186 is held on the y-axis slider 178 to be relatively movable in the x direction and bodies 160h and 162h of the first and second work units are held on x-axis slider 186.

Z-axis moving device 172 includes (a) z-axis motor 194i as a driving source, (b) a pair of guides 196i and 197i that extend in the z direction and are separated in the x direction, (c) z-axis slider 198i that is engaged with the pair of the guides 196i and 197i, and (d) driving force transmitting section 199i that transmits linear motion to z-axis slider 198i by converting the rotation of z-axis motor 194i into linear motion. Driving force transmitting section 199i includes a screw mechanism having screw rod 200i extending in the z axis direction and a nut that is fitted to screw rod 200i. Z-axis slider 198i is held on the nut to be not relatively rotatable and to be not relatively movable, and component insertion head 160a and imaging head 160b are held on the z-axis slider 198i. Moreover, component insertion head 160a can be relatively moved with respect to z-axis slider 198i in the z direction; in this case, component insertion head 160a and imaging head 160b are respectively and independently movable in the z direction. Similarly, the z-axis moving device 173 includes (a) z-axis motor 194j, (b) a pair of guides 196j and 197j, (c) z-axis slider 198j, and (d) driving force transmitting section 199j. Driving force transmitting section 199j includes screw rod 200j and a nut, and z-axis slider 198j, on which detection head 162s is held, is held on the nut.

In this embodiment, a head three-dimensional moving device is configured of x-axis moving device 170, y-axis moving device 171, z-axis moving device 172, and the like.

Solder Applying Device

As illustrated in FIGS. 1 to 3, 9, and 10, solder applying device 24 includes (a) flow tank 206, (b) flow tank moving device 208 that moves the flow tank in the x, y, and z directions, and the like. Flow tank moving device 208 is one aspect of the flow tank three-dimensional moving device.

Flow Tank Moving Device

Flow tank moving device 208 includes x-axis moving device 210 that moves flow tank 206 in the x direction, y-axis moving device 212 that moves flow tank 206 in the y direction, and z-axis moving device 214 that moves flow tank 206 in the z direction.

X-axis moving device 210 can include, for example, (i) x-axis motor 220 as a driving source, (ii) a pair of x-axis guides 222 and 223 that extend in the x direction and are separated in the y direction, (iii) x-axis slider 224 that is engaged with the pair of x-axis guides 222 and 223, and is movable in the x direction, and (iv) driving force transmitting section 226 that transmits linear motion to x-axis slider 224 by converting the rotation of x-axis motor 220 into linear motion. Driving force transmitting section 226 includes a screw mechanism having screw rod 228 extending in the x direction and nut 229 that is fitted to screw rod 228. X-axis slider 224 extends in the y direction and is held on nut 229 to be not relatively rotatable and to be not relatively movable.

Figure 9:
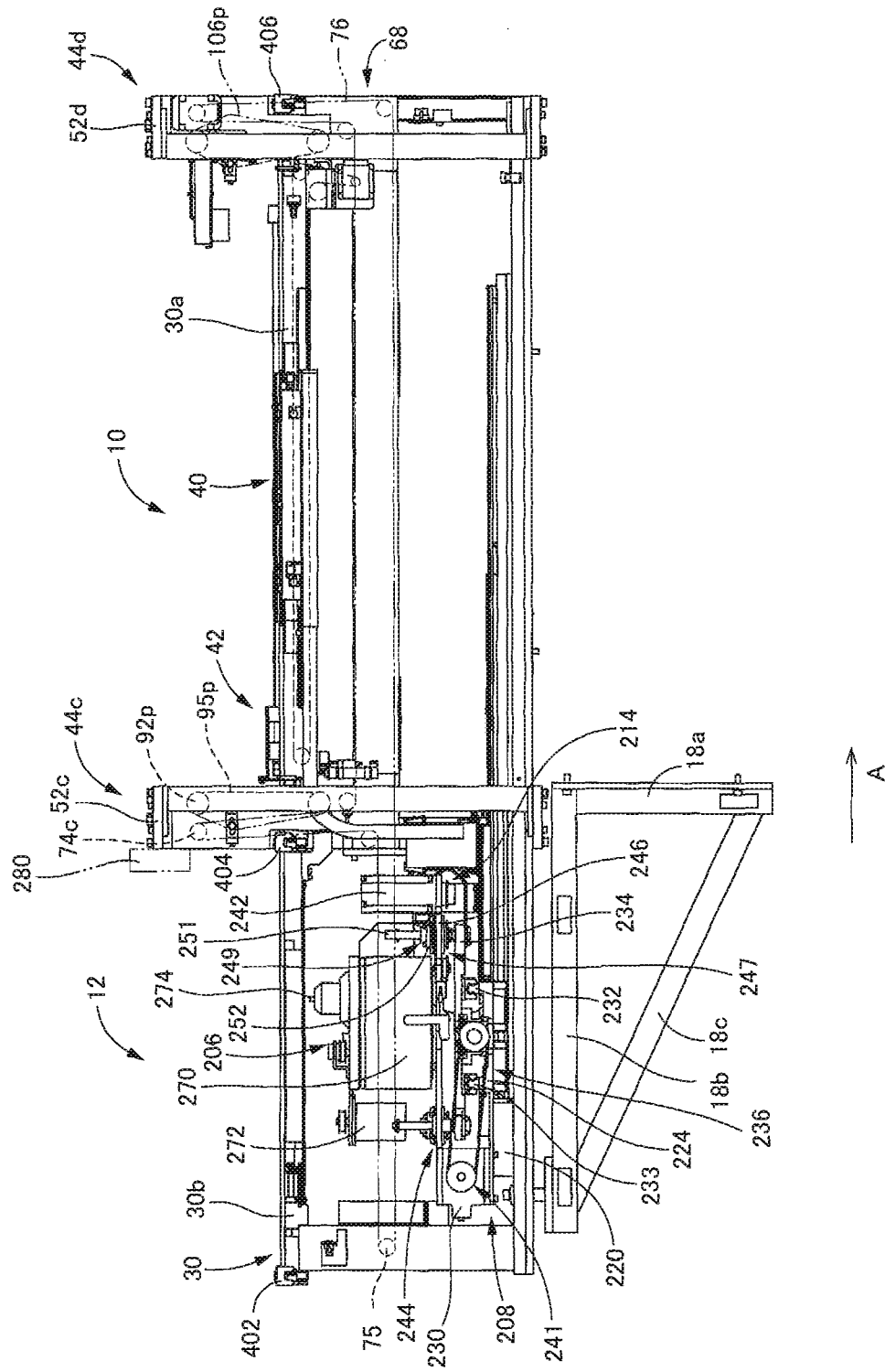
FIG. 9 is a front view of a flow tank moving device and the board conveyance device of the electronic component mounting device.
Figure 10:
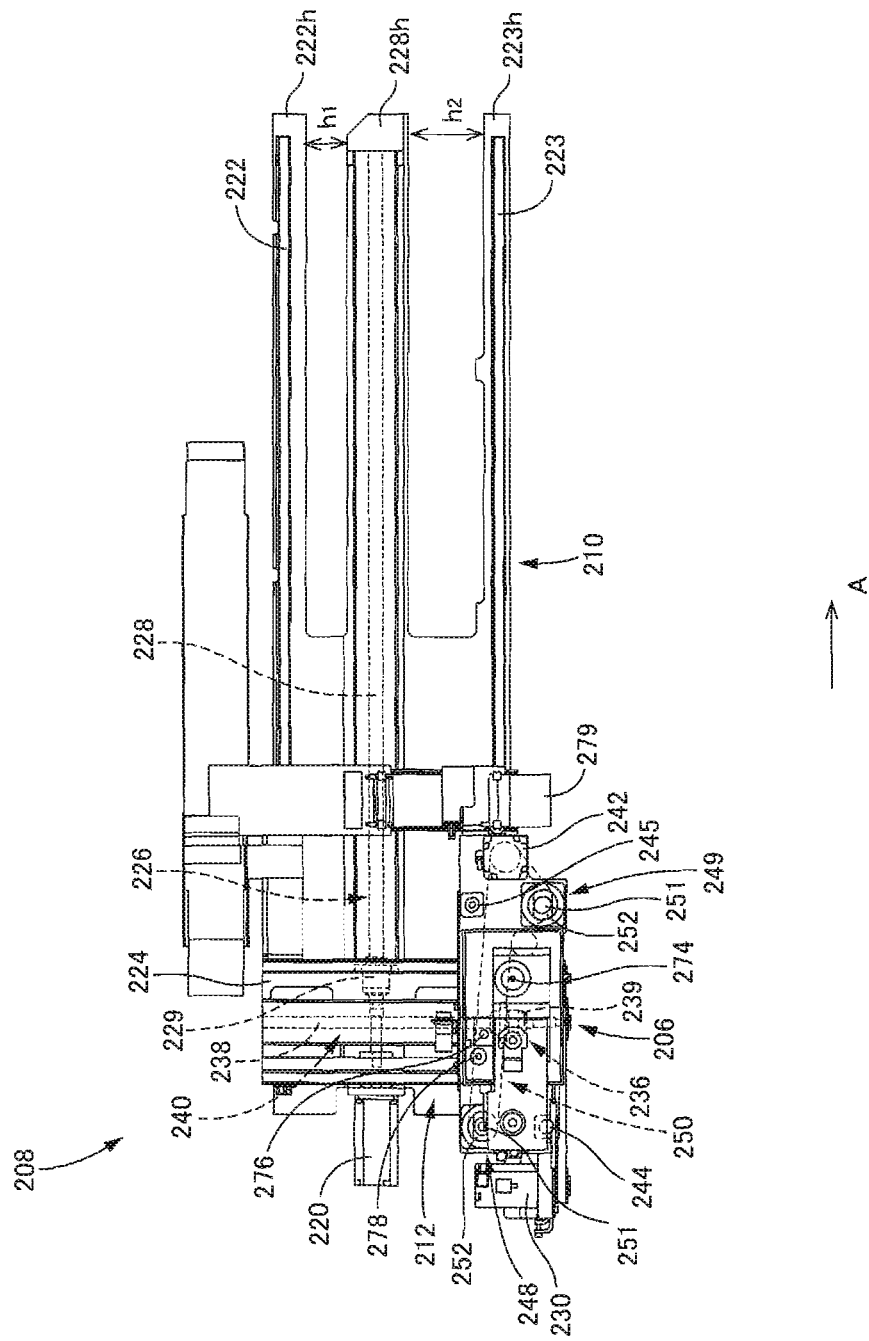
FIG. 10 is a plan view of the flow tank moving device.

As illustrated in FIGS. 2, 3, and 9, the pair of x-axis guides 222 and 223, and screw rod 228 extend over both sub-module 12 and main module 10. As a result, x-axis slider 224 is movable between main module 10 and sub-module 12 in the x direction. In addition, x-axis guides 222 and 223, and screw rod 228 extend parallel to guides 30 and 32 of board conveyance device 20. As a result, x-axis slider 224 is movable along the conveying direction of board S. Moreover, as illustrated in FIG. 10, x-axis guides 222 and 223, and screw rod 228 are parallel to each other and screw rod 228 is provided on a side closer to x-axis guide 222 from the center between x-axis guides 222 and 223. Screw rod body 228$h$ that holds screw rod 228 and guide bodies 222$h$ and 223$h$ that respectively hold x-axis guides 222 and 223 are provided in a comb shape, and gaps h1 and h2 are respectively provided therebetween. In addition, the width of guide bodies 222$h$ and 223$h$ in the y direction is smaller than the width of screw rod body 228$h$ and gap h1 is smaller than gap h2 (h1<h2).

Y-axis moving device 212 is provided in x-axis slider 224 and can include, for example, (i) y-axis motor 230 as a driving source, (ii) a pair of y-axis guides 232 and 233 that extend in the y direction and are separated in the x direction, (iii) y-axis slider 234 that is engaged with the pair of y-axis guides 232 and 233, and (iv) driving force transmitting section 236 that transmits a driving force of y-axis motor 230 to y-axis slider 234. Driving force transmitting section 236 includes screw mechanism 240 that has screw rod 238 extending in the y direction and nut 239 fitted to screw rod 238, and rotation transmitting section 241 that transmits rotation of y-axis motor 230 to screw rod 238. As illustrated in FIGS. 3 and 9, rotation transmitting section 241 includes a driving pulley that is connected to screw rod 238 and a belt hung on an output shaft of y-axis motor 230 and the driving pulley. Y-axis slider 234 is attached to nut 239 to be not relatively rotatable and to be not relatively movable. Rotation of y-axis motor 230 is transmitted to screw rod 238 by rotation transmitting section 241 and y-axis slider 234 is moved via screw mechanism 240 in the y direction.

Z-axis moving device 214 is provided in y-axis slider 234 and can include (i) z-axis motor 242 as a driving source, (ii) a pair of z-axis guide mechanisms 244 and 245, (iii) z-axis slider 246 that is engaged with the pair of z-axis guide mechanisms 244 and 245, and (iv) driving force transmitting section 247 that transmits a driving force of z-axis motor 242 to z-axis slider 246. Driving force transmitting section 247 includes a pair of ball screw mechanisms 248 and 249, and rotation transmitting section 250 that transmits rotation of z-axis motor 242 to ball screw mechanisms 248 and 249. Ball screw mechanisms 248 and 249 respectively include screw rod 251 extending in the z direction and nut 252 that is fitted to screw rod 251; rotation transmitting section 250 includes a driving pulley that is provided on each of the screw rods 251, and a chain that is provided between two driving pulleys and an output shaft of z-axis motor 242. Guide mechanisms 244 and 245 respectively include an outer cylinder and an inner cylinder; one of the pair of the outer cylinder and the inner cylinder is attached to y-axis slider 234 and the other is attached to z-axis slider 246. Z-axis slider 246 is attached to the pair of nuts 252 to be not relatively rotatable and to be not relatively movable.

The pair of guide mechanisms 244 and 245, and the pair of ball screw mechanisms 248 and 249 are respectively provided in a diagonal position to each other in a plan view of z-axis moving device 214. The rotation of z-axis motor 242 is transmitted to the pair of screw rods 251 via rotation transmitting section 250 and screw rods 251 are respectively rotated. Thus, z-axis slider 246 is moved along the pair of guide mechanisms 244 and 245 in the z direction.

Flow Tank

Figures 11A, 11B:
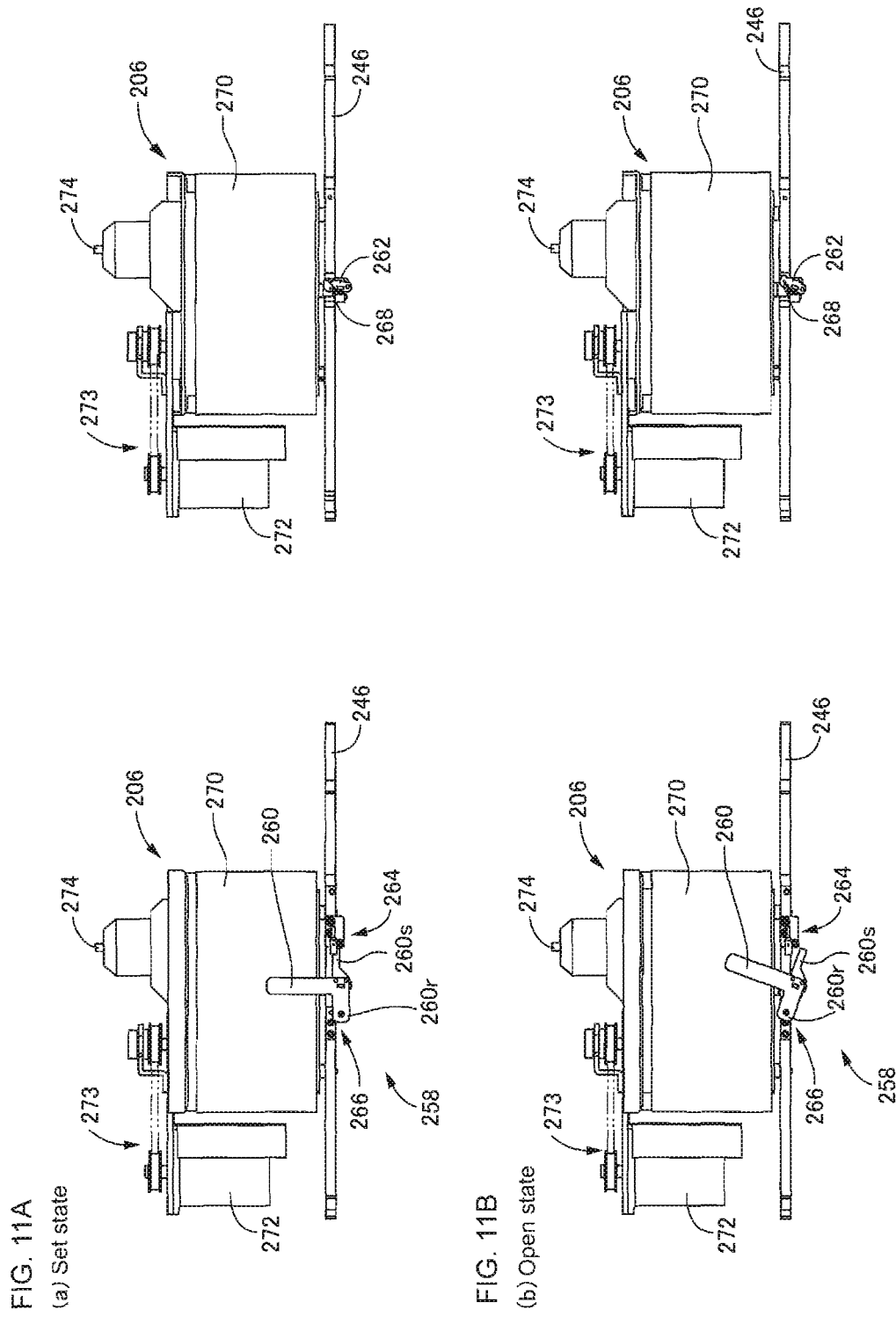
FIG. 11A illustrates a set state of the flow tank and FIG. 11B illustrates an open state.

As illustrated in FIGS. 11($a$) and 11($b$), flow tank 206 is removably attached to z-axis slider 246 by mounting and dismounting device 258.

Mounting and dismounting device 258 includes (i) lever 260, (ii) hook 262 that is rotated in accordance with rotation of lever 260, (iii) lever position sensor 264 that detects the rotational position of lever 260, (iv) rotation prevention mechanism 266 that prevents rotation due to vibration or the weight of lever 260, and the like.

Hook 262 is rotatably provided on z-axis slider 246 and is switched between an engaging position in which hook 262 is engaged with engaging convex section 268 provided in flow tank 206, and an engaging release position in which hook 262 is separated from engaging convex section 268 by operation of lever 260. As illustrated in FIG. 11($a$), in the engaging position of hook 262, flow tank 206 is in a set state in which flow tank 206 is connected to z-axis slider 246. As illustrated in FIG. 11($b$), in the engaging release position of hook 262, flow tank 206 is in an open state in which connection between flow tank 206 and z-axis slider 246 is released and flow tank 206 is removed from z-axis slider 246. If detection tip section 260$s$ of lever 260 is in the set position corresponding to the engaging position of hook 262, the lever position sensor 264 is turned on. Rotation prevention mechanism 266 allows rotation by manual operation of lever 260 by an operator and prevents rotation due to the weight or the vibration. Rotation prevention mechanism 266 can include, for example, a spring and a ball (not illustrated) provided on the inside of rotation prevention tip section 260$r$ of lever 260, an engaging recessed portion provided on an end surface of z-axis slider 246, and the like. In a state where the ball protrudes due to the spring, the ball is prevented from being moved below z-axis slider 246, or in a state where the ball is positioned in an engaging recessed portion, lever 260 is prevented from being rotated due to vibration or the weight of lever 260, but when an operational force of the operator is applied, the ball is pressed against an elastic force of the spring by the end surface of z-axis slider 246 and the rotation of lever 260 is allowed.

As illustrated in FIGS. 1 to 3, and 9 to 11, flow tank 206 holds and ejects solder in a molten state, and, for example, can include (i) body 270 that accommodates solder in a molten state, (ii) jet motor 272, (iii) a pump (not illustrated) that is provided on the inside of body 270 and is driven by jet motor 272, (iv) driving force transmitting section 273 that transmits a driving force of jet motor 272 to a screw of the pump, (v) nozzle 274 as a viscous fluid ejection section that ejects solder, (vi) float 276 (see FIG. 10), (vii) solder replenishment port 278, and the like. Driving force transmitting section 273 transmits rotation of jet motor 272 to a propeller shaft that is a driving shaft of the screw and includes, for example, a pulley connected to the propeller shaft, a belt, and the like. In flow tank 206, solder is ejected from nozzle 274 by an operation of the screw by the driving of jet motor 272. In addition, float 276 is moved in an upward and downward direction in compliance with a solder amount (remaining amount) accommodated in body 270 and a position of float 276 in the upward and downward direction corresponds to the remaining amount of solder. Moreover, reference numeral 279 illustrated in FIG. 10 indicates a member (cable or the like) that is integrally movable with flow tank 206.

When component mounting is performed, in main module 10, flow tank 206 is moved to a predetermined position (hereinafter, referred to as a solder applying target point) of board S, which is set in advance and to which solder is to be applied, by x-axis moving device 210 and y-axis moving device 212 while solder is ejected from nozzle 274; at this position, flow tank 206 is raised to a height at which solder is applied to board S by z-axis moving device 214. Then, after solder has been applied to the solder applying target point of board S, flow tank 206 is lowered and moved to the next solder applying target point.

Note that, when performing maintenance and the like, ejection of solder is stopped from nozzle 274 and flow tank 206 is moved to sub module 12.

<Flow Tank Maintenance Device>

Flow tank maintenance device 26 is a configuration element of the sub module 12 and, as illustrated in FIGS. 1, 2, and 12, includes (i) inspection unit 280 that checks the remaining amount of solder or checks a jet height for flow tank 206 and (ii) solder replenishment device 282 that supplies solder if the remaining amount of solder is small.

Inspection Unit

Inspection unit 280 is attached to guide device 286 that is provided in a portion of portal frame 44c on an upstream side of upper bar 52c and extends in the y direction. Inspection unit 280 can include, for example, (i) unit body 288 that is engaged with guide device 286, (ii) z-axis slider 290 that is relatively movable with respect to unit body 288 in the z direction, (iii) z-axis moving device 292 that moves z-axis slider 290 in the z direction, (iv) jet height sensor 294 and solder remaining amount sensor 296 that are provided on z-axis slider 290, and the like. Unit body 288 includes engaging section 298 that is engaged with guide device 286 and can be manually moved in the y direction. Z-axis moving device 292 can include, for example, linear motion type cylinder 300 as a z-axis driving source and a pair of guide mechanisms 302 and 303. Cylinder 300 includes cylinder body 304 and piston rod 305; cylinder body 304 is fixed to unit body 288 in a posture extending in the z direction, piston rod 305 passes through unit body 288, and then cylinder 300 is fixed to z-axis slider 290. Guide mechanisms 302 and 303 are provided on both sides of cylinder 300 in the x direction and, for example, can include respectively an outer cylinder and an inner cylinder slidable with respect to each other. One (for example, outer cylinders 302h and 303h) of the outer cylinder and the inner cylinder is fixed to unit body 288 in a posture extending in the z direction and the other (for example, inner cylinders 302i and 303i) is fixed to z-axis slider 290 passing through unit body 288.

Jet height sensor 294 detects whether the ejection height of solder is equal to or greater than a predetermined height (whether the ejection height reaches the predetermined height) and can include, for example, solder detection section (for example, electrode) 308 that is provided at a tip of a detection bar protruding from z-axis slider 290 in the y direction. Since electrodes 308 are energized if solder is applied to the pair of electrodes 308, it can be seen whether solder ejected from nozzle 274 reaches electrodes 308. Solder remaining amount sensor 296 is a proximity sensor that detects the position of float 276 provided in flow tank 206 and is provided to protrude from z-axis slider 290 on a lower side. If float 276 is present within a predetermined range, it can be seen that the remaining amount of solder of flow tank 206 is within the predetermined range and replenishment is not necessary. If flow tank 206 and inspection unit 280 are in a predetermined relative position, jet height sensor 294 and solder remaining amount sensor 296 are provided in positions facing nozzle 274 and float 276.

In addition, handle 309 is used when moving inspection unit 280.

Note that, in the example, an inspection section is configured of z-axis slider 290, jet height sensor 294, solder remaining amount sensor 296, and the like; an inspection section moving device is configured of unit body 288, z-axis moving device 292, guide device 286, and the like. The inspection section is movable in the z axis direction and in the y direction.

Solder Replenishment Device

Solder replenishment device 282 includes solder supplying machine 310, solder thread guide 312, and the like. As illustrated in FIGS. 1 and 2, solder supplying machine 310 includes bobbin 314 on which solder thread (solder that is in a solid state, not in a viscous fluid state, hereinafter referred to as solder thread 313) is wound and feeding section 316 that feeds the thread of solder from solder supplying machine 310, and is provided on frame 18 of sub module 12. Solder thread guide 312 protrudes to z-axis slider 290 of inspection unit 280 in the x direction, that is, if flow tank 206 and z-axis slider 290 are in a predetermined relative positional relationship, solder thread guide 312 is provided in a position facing solder replenishment port 278.

Note that, although solder thread guide 312, solder remaining amount sensor 296, and the like can be provided in flow tank 206, if they are provided in flow tank 206, they are likely to interfere with board conveyance device 20 and the like, thus the range in which flow tank 206 can be moved is narrowed, and the range in which solder can be applied to board S is narrowed. However, if solder thread guide 312, solder remaining amount sensor 296, and the like are removed from flow tank 206, it is possible to reduce the size of flow tank 206 and to widen the range in which solder can be applied to board S.

In addition, if solder thread guide 312 and solder remaining amount sensor 296 are removed from flow tank 206, solder remaining amount sensor 296 and the like are not constantly heated by flow tank 206, thus solder thread 313 within solder thread guide 312 is prevented from melting by the heat of flow tank 206.

<Board Pre-Heating Device>

Board pre-heating device (hereinafter, simply referred to as a heating device; the board pre-heating device is an example of the heating device) 28 is a configuration element of sub module 12 and, as illustrated in FIGS. 2 and 13, is provided in a portion between groove-shaped frame 46 and portal frame 44c in the x direction. Heating device 28 includes (a) frame 350, (b) heater 352, and (c) heater moving device 354; heater 352 is movable in the y direction between a heating position within a conveying path of board S and a standby position outside the conveying path of board S in the y direction.

Figure 13A:
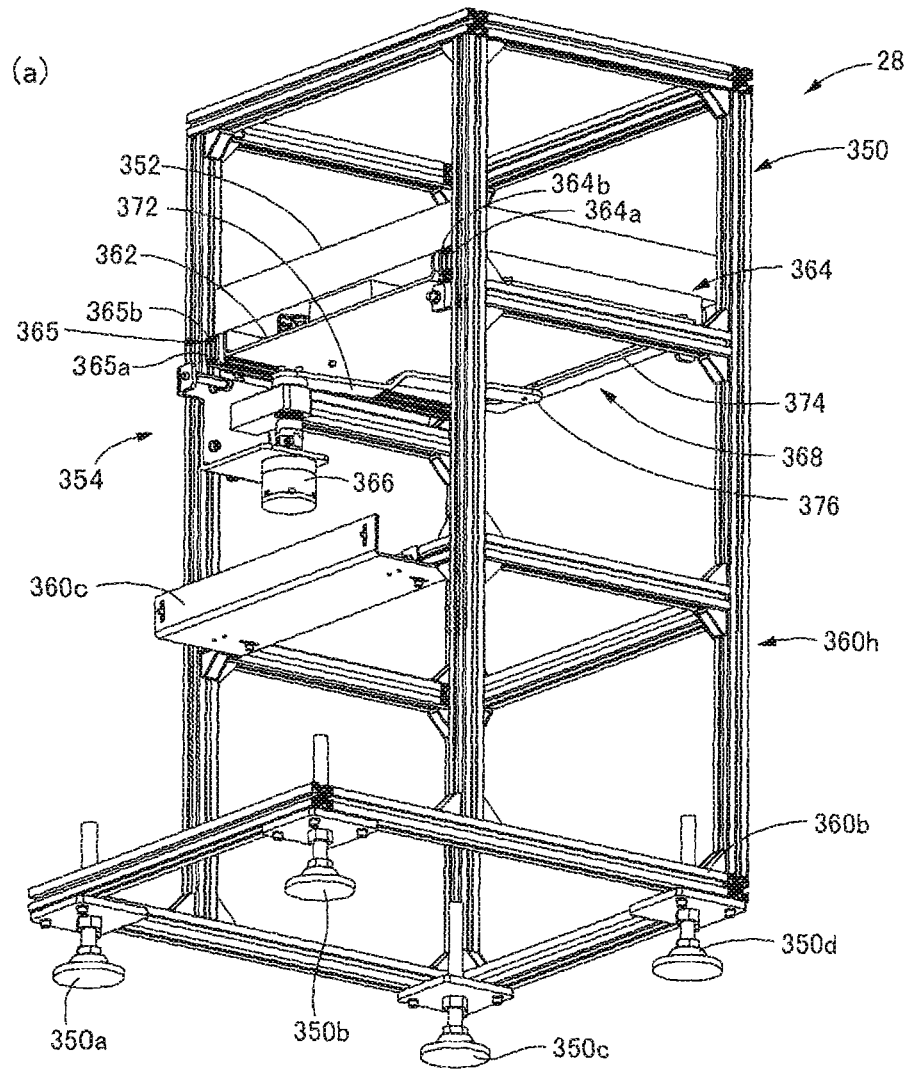
FIG. 13A is a perspective view of a board pre-heating device of the electronic component mounting device.

As illustrated in FIG. 13(a), frame 350 includes base frame 360b that is supported by four legs 350a, b, c, and d, and main frame 360h that is formed of a substantially rectangular parallelepiped. Main frame 360h is erected in a position separated from a portion of base frame 360b, that is, separated from two legs 350a and b. Positioning member 360c and heater moving device 354 are provided in an intermediate portion of main frame 360h. Frame 350 has a shape such that the two legs 360a and b are positioned below board conveyance device 20, positioning member 360c abuts against frame 18a (side opposite to the front side), and main frame 360h is positioned separated from board conveyance device 20 in the y direction. Heater (since heating is performed before component mounting, hereinafter referred to as a pre-heater) 352 is a panel type far-infrared heater, an upper surface is a heating surface, and a lower surface side is held in a heater holding section 362. Heater moving device 354 includes (i) y-axis guides 364 and 365 that are provided on a pair of members of main frame 360h separated in the x direction, (ii) y-axis driving source 366, and (iii) driving force transmitting section 368 that transmits a driving force of y-axis driving source 366 to heater holding section 362. A pair of y-axis guides 364 and 365 respectively include fixed rails 364a and 365a that are fixed to main frame 360h, and movable rails 364b and 365b that are fitted into fixed rails 364a and 365a to be relatively movable in the y direction; rails on the heater side provided in both end portions of heater holding section 362 in the x direction are engaged with movable rails 364b and 365b to be relatively movable in the y direction. As described above, since two sets ([fixed rail and movable rail] and [movable rail and rail on heater side]) of rail pairs fitted to be relatively movable in the y direction are provided, it is possible to increase the stroke of heater 352 in the y direction.

In this embodiment, Y-axis driving source 366 is a rotary actuator and includes swing arm 372 as an output member. The rotary actuator may be an electric actuator or a hydraulic actuator. Driving force transmitting section 368 includes groove 374 that is formed on a lower surface of heater holding section 362 and extends substantially in the x direction and engaging section 376 in which swing arm 372 and groove 374 are engaged in a state where heater holding section 362 is movable in the y direction with the rotation of swing arm 372.

Figure 13B:
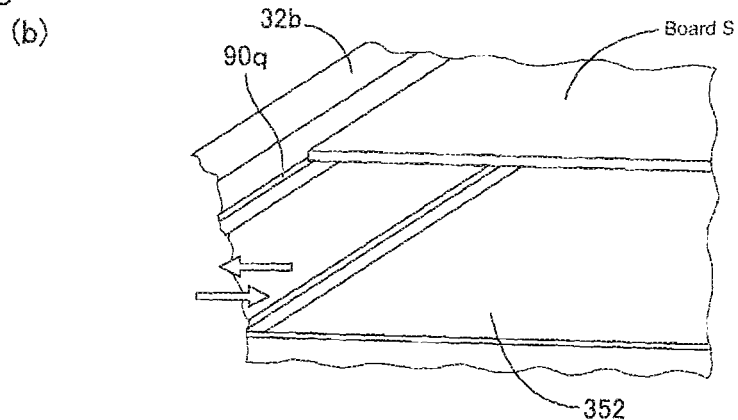
FIG. 13B is a view illustrating heating of a printed circuit board by a heater of the board pre-heating device.

When swing arm 372 is rotated by operation of rotary cylinder 366, accordingly, the position of engaging section 376 of swing arm 372 and heater holding section 362 is moved along an arc and thus heater 352 is moved in the y direction. Heater 352 is movable between a standby position that is inside main frame 350h and is outside the conveying path of board S as illustrated in FIG. 13(a), and a heating position that is within the conveying path of board S as illustrated in FIG. 13(b). In the heating position, heater 352 is positioned below board S and the heating surface faces the surface to which solder is planned to be applied (lower surface) of board S.

As described above, heater 212 is movable between the heating position below board conveyance device 20 and the standby position which is outside board conveyance device 20 in the horizontal direction and at which board S is not heated, thus, maintenance of heater 352 is made easy. In addition, with heater 352 in the standby position, a region (which can be referred to as a heating region) into which heater 352 of board conveyance device 20 is planned to be introduced can be used for another purpose. For example, it is possible to use the region as a region in which maintenance of the flow tank is performed, or as the standby region of board S. Since it is possible to use the region within sub-module 12 for multiple different purposes as above, it is possible to reduce the size of the electronic component mounting device and to achieve space-saving.

In y-axis moving device 354, a motion conversion mechanism in which the y-axis driving source is an electric motor and which includes a screw mechanism can be used as the driving force transmitting section, but this increases the number of components and is more expensive. In addition, the y-axis driving source can be a linear motion type actuator (for example, a cylinder), but in order to make the stroke of the heater 352 large, a linear motion type actuator which is long in the y direction is necessary, thus causing a space problem. However, because there is little need for good positioning accuracy of heater 352, the need to use an electric motor is low. Thus, by making the y-axis driving source a rotary actuator, it is possible to suppress an increase in the cost while solving the space problem.

<Control Device>

Figure 14:
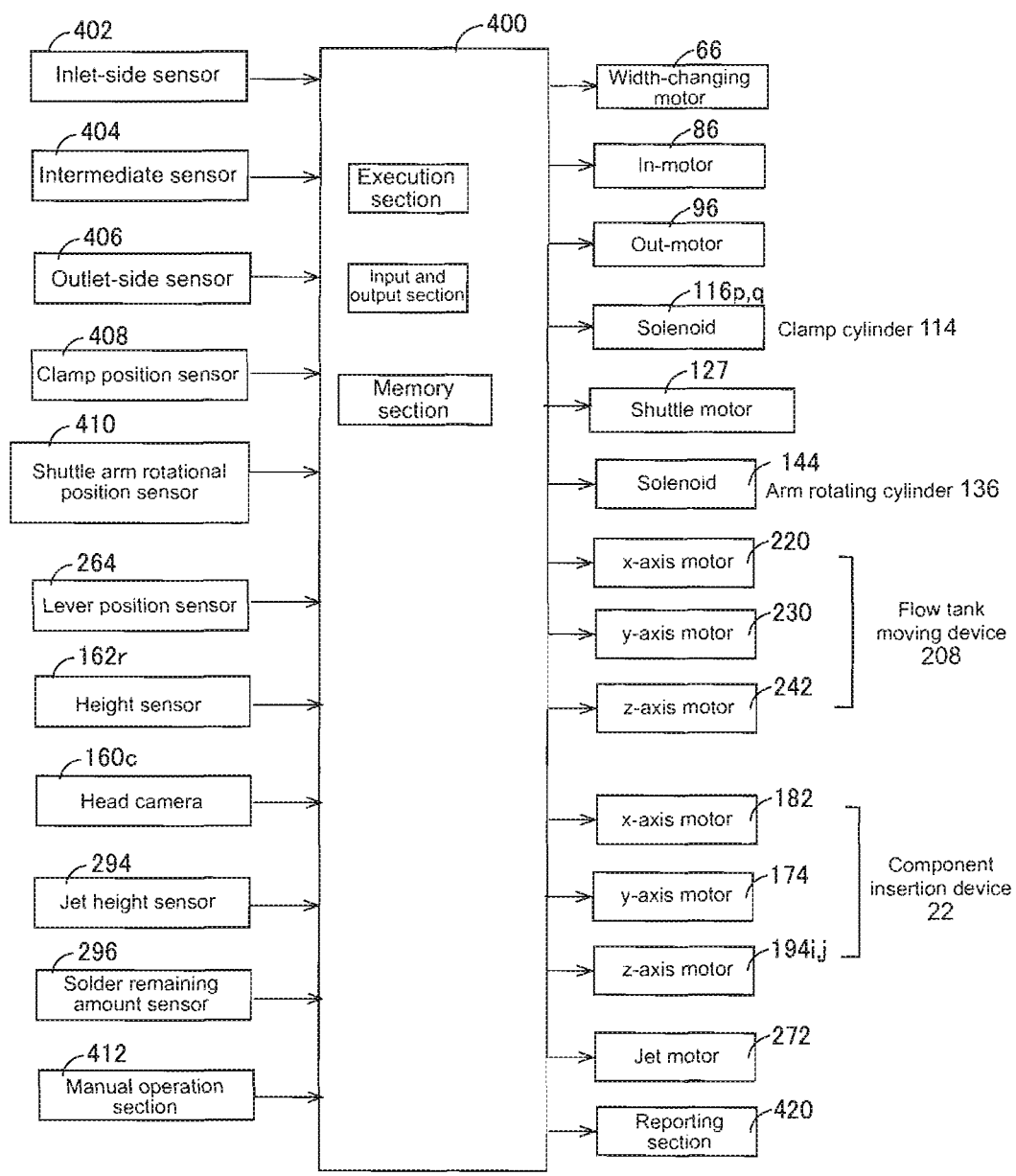
FIG. 14 is a view conceptually illustrating a control device of the electronic component mounting device.

The component mounting device is controlled based on commands of control device 400, illustrated in FIG. 14, which is mainly configured of a computer. Control device 400 is connected to inlet-side sensor 402, intermediate sensor 404, outlet-side sensor 406, clamp position sensor 408, shuttle arm rotational position sensor 410, lever position sensor 264, height sensor 162r, head camera 160c, jet height sensor 294, solder remaining amount sensor 296, manual operation section 412, and so on; furthermore, control device 400 is connected to width changing motor 66, in-motor 86, out-motor 96, shuttle motor 127, electromagnetic valve solenoids 116p and q that drive clamp cylinders 114p and q, electromagnetic valve solenoid 144 that drives shuttle arm rotating cylinder 136, jet motor 272, x-axis motor 220 and y-axis motor 230 and z-axis motor 242 of the flow tank moving device 208, x-axis motor 182 and y-axis motor 174 and z-axis motors 194i and j of the component insertion device 22, reporting section 420, and so on.

Inlet-side sensor 402 is provided at an end portion on the upstream side of sub-module 12, intermediate sensor 404 is provided at an end portion on the upstream side of main module 10, and outlet-side sensor 406 is provided in an end portion on the downstream side. It can be understood that board S has moved between main module 10 and sub-module 12 by intermediate sensor 404. In addition, reporting section 420 reports a detection result of the sensors, the number of boards S on which component mounting has been performed, errors, and the like, and, for example, may include a display or a lamp and a speaker.

<Operation During Component Mounting>

Figure 15:
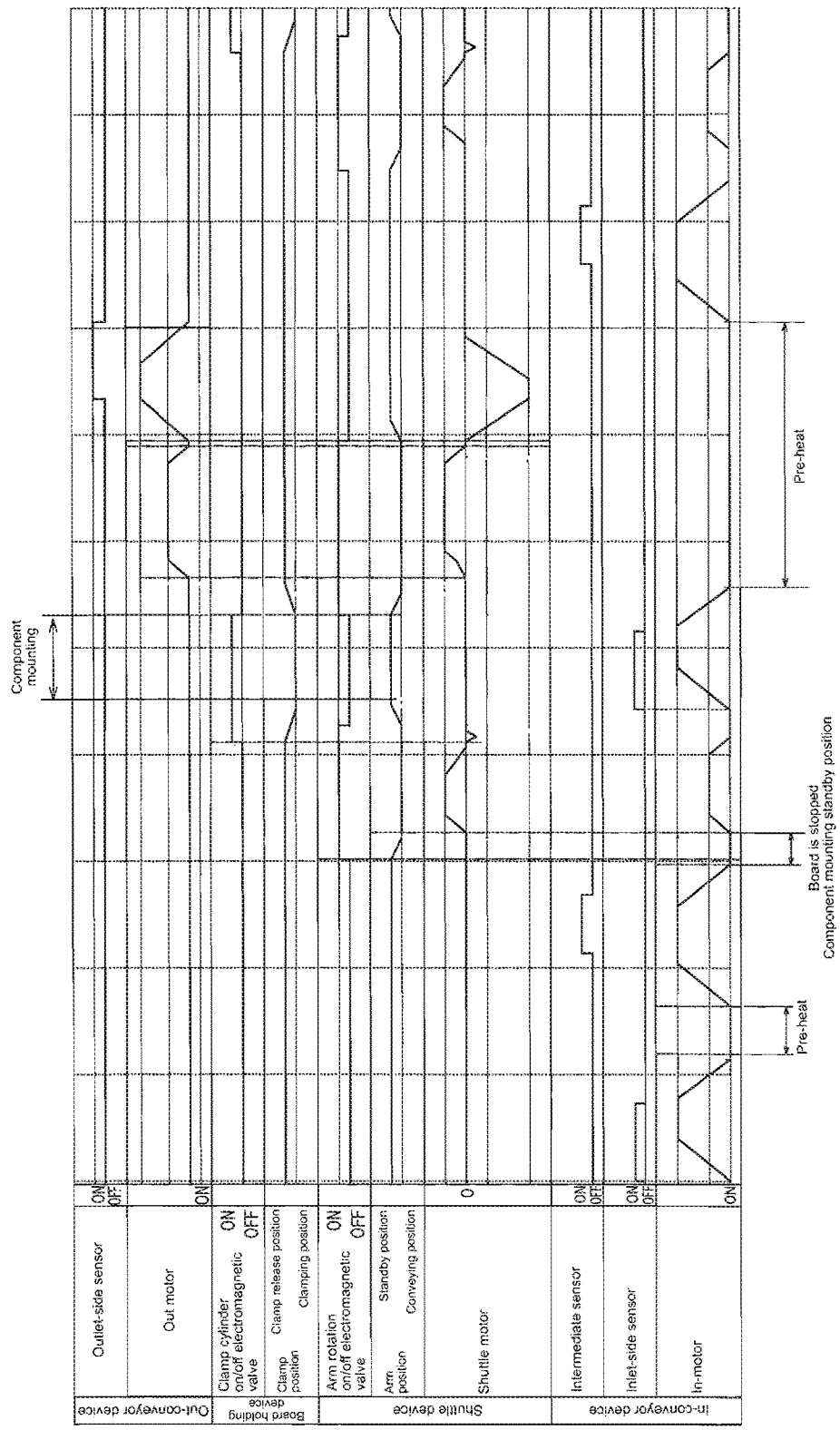
FIG. 15 is a time chart illustrating an example of operation of the electronic component mounting device.

An example of control of the electronic component mounting device will be described with reference to the time chart of FIG. 15. The time chart is determined by the size of board S, the conveying speed of board S, the operation speed of actuators such as motors and cylinders, and the like, thus, if the size of the board S changes, the time chart also changes.

When component mounting is performed, heater 352 is in the heating position. In addition, inspection unit 280 is in a position indicated by a solid line in FIG. 12(a) and z-axis slider 290 is at an upper end position. This position is the standby position of inspection unit 280 and is a position that does not interfere with components and the like even if a board S on which components have been mounted in advance is conveyed by the in-conveyor device 36.

(1) Board S is supplied to sub-module 12 in the direction of arrow A illustrated in FIGS. 1 and 2. When board S is detected by inlet-side sensor 402, in-motor 86 is actuated and stopped after passing of the board S is detected. Board S is conveyed by in-conveyor device 36 and is stopped in a predetermined position (referred to as the board pre-heating position) above heater 352.

(2) Board S is stopped at the board pre-heating position for a predetermined pre-heat time.

(3) Thereafter, in-motor 86 is actuated, board S is detected by the intermediate sensor 404, and then the board S is stopped after a set time has elapsed. Board S is moved to main module 10 by in-conveyor device 36 and is stopped at a predetermined component mounting standby position.

(4) In shuttle device 42, arm rotating cylinder 136 is operated and shuttle arm 121 is rotated from the standby position to the conveying position. After shuttle arm rotational position sensor 410 detects that shuttle arm 121 has reached the conveying position, shuttle motor 127 and in-motor 86 are simultaneously actuated. At this time, a rear end portion of board S is on the downstream side of shuttle arm 121 (separated from shuttle arm 121) and board S is moved by in-conveyor device 36. Thereafter, shuttle 122 catches up board S and shuttle arm 121 abuts board S. Board S is moved by shuttle 122.

(5) Shuttle motor 127 and in-motor 86 are stopped after a set time has elapsed. Board S is stopped at a predetermined position of rails 110p and q. In addition, shuttle 122 is slightly returned and shuttle arm 121 is rotated to the standby position. Shuttle 122 is retracted to prevent interference with the board S when shuttle arm 121 is next rotated to the conveying position.

(6) Clampers 112p and q are moved from the clamp release position to the clamping position by the operation of clamp cylinders 114p and q, and board S is clamped in the upward and downward direction by rails 110p and q, and clampers 112p and q.

(7) After clamping, component mounting is performed on board S. Solder is applied by flow tank 206 from below in parallel with insertion of an electronic component by component insertion head 160a from above board S, and thereby the component is mounted. The position of the board S is the component mounting position.

During component mounting, component mounting and applying of solder are performed in parallel and, there are cases where, for example, (i) applying of solder is performed in a state where the component is held by component insertion head 160a, (ii) insertion of components is continuously performed without waiting for applying of solder, and (iii) insertion of the component and applying of solder are substantially simultaneously performed.

(8) When component mounting has been completed, clampers 112p and q are moved from the clamping position to the clamp release position and shuttle arm 121 is rotated from the standby position to the conveying position. Shuttle motor 127 and out-motor 96 are simultaneously actuated. Since board S is on rails 110p and q, board S is initially conveyed by shuttle 122, but after board S is moved from rails 110p and q to chains 100p and q, board S is conveyed by out-conveyor device 38.

(9) After a set time has elapsed, shuttle motor 127 is stopped, shuttle arm 121 is rotated to the standby position, and shuttle motor 127 is operated in the opposite direction. Shuttle 122 is moved in a direction opposite to the direction of arrow A and is returned to the original position. Out-motor 96 is accelerated after being decelerated and is stopped if the passing of board S is detected by outlet-side sensor 406.

(10) The next board S is loaded while component mounting on board S is performed. When the next board S is detected by inlet-side sensor 402, in-motor 86 is actuated and is stopped at the same timing. Board S is moved to the board pre-heating position and stopped. When outlet-side sensor 406 detects the passing of board S, conveyance of the next board S to main module 10 is permitted. In-motor 86 is actuated and board S is moved to the component mounting standby position. Hereinafter, the same control is repeatedly performed. This means that the pre-heating time of the next board S is long, but since there is no way the temperature of board S will become higher than the temperature of heater 352, there is no problem.

As described above, in this embodiment, the component mounting region can be determined based on a region in which component mounting is performed in a state where board S is clamped by board holding device 40, and the heating region can be determined based on a region in which board S is in the board pre-heating position and is heated by heater 352. In this case, the component mounting region and the heating region are determined based on the size of board S. The component mounting region and the heating region can be regions (same region) corresponding to the size of board S or can be regions wider than the region corresponding to the size of board S. In the embodiment, the heating region can also be referred to as the pre-heating region.

In addition, the component mounting region can be determined based on a section at which board holding device 40 is provided and the heating region can be determined based on a section that is heated by heater 352. In this case, the length of rails 110p and q or clampers 112p and q can be determined based on the area of the heating surface of heater 352 and the like. Furthermore, the component mounting region can be determined based on the movable range of component insertion head 160a, the movable range of flow tank 206, and the like.

As described above, in this embodiment, board S is conveyed by rails 110p and q in the component mounting region and is conveyed by in-conveyor device 36 in the heating region. Since a friction force generated between board S and chains 90p and q is smaller than that generated between board S and rails 110p and q, it is possible to make the moving speed of the in-conveyor device 36 greater than that of the shuttle device 42. As a result, it is possible to reduce the time required for movement of board S compared to a case where board S is held by rails in both the heating region and the component mounting region and is moved by shuttle device 42.

In addition, since the friction force between rails 110p and q, and board S is great, it is possible to accurately stop board S in the component mounting position. As a result, it is possible to improve position accuracy of the electronic component mounting.

Furthermore, in the component mounting region, since chains 90p and q are not present, it is possible to increase the space below rails 110p and q. As a result, it is possible to widen the movable range of flow tank 206 and to widen the component mountable region on board S.

In addition, rails 110p and q have excellent heat resistance and dimensional stability compared to chains and belts. Rails 110p and q are unlikely to be degraded by being heated by flow tank 206 and changes thereof over time are small. As a result, it is possible to satisfactorily convey board S for a long period of time.

<Correction of Position (x, y) of Flow Tank in Horizontal Direction>

If board S is in the component mounting position, the solder applying target point (xref, yref) of board S and the position (x, y) of nozzle 274 of flow tank 206 (strictly speaking, the position of nozzle 274 in a case where x-axis motor 220 and y-axis motor 230 are controlled by a control command value that is determined by the solder applying target point) may not match. To counter this, the deviation between the solder applying target point of board S and the position of the nozzle 274 can be obtained and x-axis motor 220 and y-axis motor 230 can be controlled considering the deviation.

For example, if imaging is performed by head camera 160c using a transparent plate (for example, glass plate) instead of board S, it is possible to obtain the deviation between the position (x, y) of nozzle 274 and the solder applying target point (xref, yref). In addition, it is possible to obtain the deviation between the position of solder actually applied to the glass plate by flow tank 206 and the solder applying target point. Furthermore, it is possible to measure the deviation by removing board S after solder has actually been applied to board S (opaque plate).

In either case, the control command values to x-axis motor 220 and y-axis motor 230 are corrected based on the deviation and it is possible to improve the positional accuracy of solder applying of board S by controlling based on corrected control command values. Moreover, measurement of the deviation can be performed periodically (for example, every a certain number of boards that is set in advance), can be performed when failure of solder applying is detected, and the like.

<Correction of Height (z) of Flow Tank>

Board S is heated by heater 352 before solder is applied, thus board S may be deformed (for example, warpage is generated) due to the heating, and the gap between the solder applying target point on board S and nozzle 274 may be different from a predetermined set value href. If the gap between the solder applying target point of board S and the nozzle 274 is too large, there is a concern that solder ejected from nozzle 274 will not reach board S or that insufficient solder will be applied to board S. To counter this, in the embodiment, an actual interval h* between the solder applying target point of board S and nozzle 274 is obtained using height sensor 162r attached to work unit 162 and control of the height of flow tank 206 is controlled based on the actual interval h*.

Figure 16A:
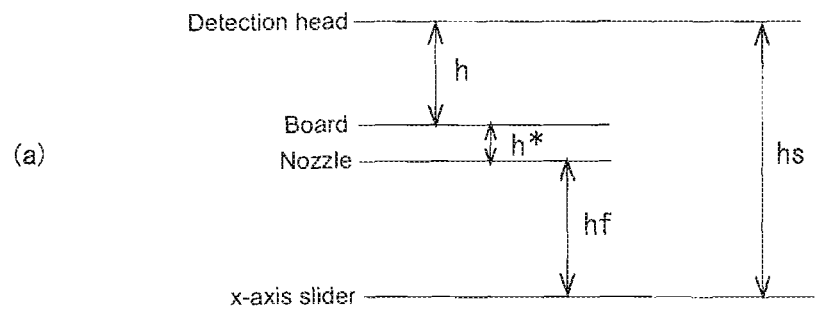
FIG. 16A illustrates the relative positional relationship between a head, a nozzle, and the board.
Figure 16B:
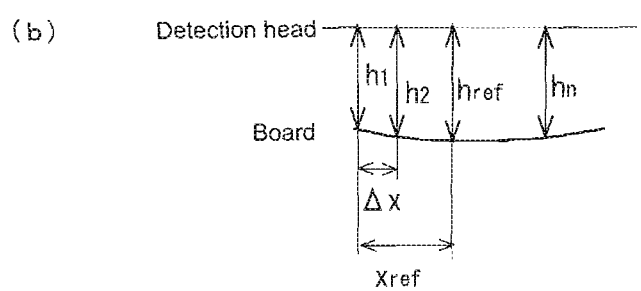
FIG. 16B illustrates the relationship between warpage of the board and the height of the board.

For example, as illustrated in FIG. 16(a), a distance (gap) hs between a reference point (for example, a point on x-axis slider 224 of flow tank 206) and detection head 162s, and a distance hf between the reference point and nozzle 274 (set point on the nozzle) of flow tank 206 are known from the structure of the component mounting device, z-axis moving device 173 of work unit 162, z-axis moving device 214 of flow tank 206, and the like. Thus, if an actual height h between detection head 162s and the solder applying target point of board S is detected by height sensor 162r, it is possible to obtain the actual gap h*={(hs−h)−hf} between the solder applying target point of board S and nozzle 274 of flow tank 206. In addition, as illustrated in FIG. 16(b), each of heights h1, h2 ... to multiple points on board S are detected by height sensor 162r, the warpage degree γ of board S is obtained based on the detected values h1, h2, ..., and it is possible to obtain the actual gap between the solder applying target point xref of board S and nozzle 274 based on the warpage degree γ. The actual height h may be obtained for each board S (per board) or may be obtained for each set number of boards.

Then, if the obtained actual gap h* is greater than the set value href, flow tank 206 is moved upward by the z-axis moving device 214; if the obtained actual gap h* is less than the set value href, flow tank 206 is moved downward. Thus, it is possible to make the actual gap between the target point of the board S and nozzle 274 the set value href. Even if the actual gap h* is smaller than the set value href, the solder amount to be applied will not be insufficient, thus it can be considered to be no problem. In this case, the height of flow tank 206 may be controlled so that the actual gap h* is not greater than the set value href, and it is possible to determine the height of flow tank 206 for each board S or for each set number.

In any case, since the height of flow tank 206 is controlled based on the actual gap h*, it is possible to sufficiently apply solder to the solder applying target point.

As described above, in control device 400, the height acquisition section is configured of the portion obtaining the distance h* between nozzle 274 and board S based on the detected value of height sensor 162r; thus, the height control section is configured of a portion that outputs the control command value to z-axis motor 242 by creating the control command value.

Moreover, it is preferable that the set value href is set to a height at which interference with components mounted on the lower surface of board S does not occur.

In addition, it is possible to adjust the jet height of solder without adjusting the height (z) of flow tank 206. For example, if the actual gap h* is greater than the set value href, jet motor 272 can be controlled so that the jet height is increased; and if the actual gap h* is smaller than the set value href, jet motor 272 can be controlled so that the jet height is reduced.

<Error Processing>

If an error occurs in the electronic component mounting device, shuttle 122 is moved in the reverse direction, in-motor 86 is driven in the reverse direction, and it is determined whether board S is present within the component mounting region. If board S is present in the component mounting region, board S is moved upstream by the driving of in-conveyor device 36 and moving of shuttle 122, and is detected by intermediate sensor 404. Thus, the presence or absence of the board S can be known based on a signal change of intermediate sensor 404 and error processing can be performed. However, if in-motor 86 is driven in the reverse direction, board S present within the heating region is also returned on the upstream side, but there is no need to return board S which is within the heating region to the upstream side.

Thus, when detecting the presence or absence of board S, in board moving suppression device 150, driving plates 154p and q are moved in the x direction and lift-up plates 152p and q are raised by an air cylinder. Board S is lifted and is separated from chains 90p and q. As a result, even if in-motor 86 is actuated in the reverse direction, it is possible to prevent board S moving to the upstream side.

<Maintenance (Inspection of Flow Tank and Replenishment of Solder)>

If maintenance execution condition A is established, maintenance such as inspection of flow tank 206 and replenishment of solder is performed.

Maintenance execution condition A can be a condition that is, for example, periodically established such as when the number of boards on which solder has been applied reaches a set number or when a set time has elapsed after solder applying is started, or can be a condition that is established such as when a solder applying state has been detected as defective. If maintenance execution condition A is established, loading of board S into sub-module 12 is stopped and component mounting is stopped. Heater 352 is moved to the standby position by heater moving device 354 and flow tank 206 is moved by flow tank moving device 208 to a maintenance position that is set in advance. Heater 352 is moved to the standby position such that heater 352 is not within the conveying path of board S and moving of flow tank 206 can be performed. Flow tank 206 is moved from main module 10 to sub-module 12; in portal frame 44*c* provided between main module 10 and sub-module 12, since drive transmitting shaft 94*c*, screw rod 78*c*, and the like are not present between guides 30 and 32, and flow tank moving device 208, flow tank 206 is allowed to be freely moved between main module 10 and sub-module 12.

Next, as illustrated in FIG. 12(*c*), z-axis slider 290 is moved to a lower end position by actuating cylinder 300. Then, inspection unit 280 is moved manually in the y direction by using handle 309 so that solder remaining amount sensor 296 is positioned above float 276, jet height sensor 294 is positioned above nozzle 274, and solder thread guide 312 is positioned above solder replenishment port 278. The position (relative position of inspection unit 280 with respect to flow tank 206) of inspection unit 280 is the inspection position.

It is detected whether float 276 is within the set range by solder remaining amount sensor 296. If it is detected that the remaining amount of solder is not within the set range because the amount is too small, solder is supplied. Solder thread 313 is pulled from solder supplying machine 310, is pulled around solder thread guide 312, and is inserted into solder replenishment port 278. Since flow tank 206 (solder replenishment port 278) is hot, solder thread 313 is melted and becomes a viscous fluid, and is supplied to flow tank 206. Solder thread 313 is delivered from solder supplying machine 310. The height of flow tank 206 is adjusted so that the distance between electrode 306 of jet height sensor 294 and nozzle 274 of flow tank 206 becomes a distance that is a desired distance (for example, a distance [set value href] at which solder applying is performed). In this state, solder is ejected from nozzle 274 of flow tank 206. If ejected solder reaches electrode 306, it becomes a conductive state, but if ejected solder does not reach electrode 306, it becomes a non-conductive state. The rotational speed of jet motor 272 is adjusted so as to achieve the conductive state. After completion of maintenance, inspection unit 280 is returned to the standby position indicated by the solid line of FIG. 12(*a*).

In addition, adjustment of the actuation of cylinder 300 and the rotational speed of jet motor 272, and the like can be performed by operation of manual operation section 412 or can be executed by operation of an operation section or the like provided in inspection unit 280.

Furthermore, detected results of solder remaining amount sensor 296 and jet height sensor 294 are reported to reporting section 420; however, a reporting section can be provided in inspection unit 280.

In the embodiment, in control device 400, when maintenance execution condition A is established, a flow tank moving control section is configured of a section that creates and outputs control command values with respect to flow tank moving device 208 during maintenance so that flow tank 206 is moved to the maintenance position. Moreover, it can also be regarded that maintenance execution condition A is established by manual operation section 412 being operated by an operator.

<Maintenance (Removing)>

If maintenance execution condition B is established, removing of flow tank 206 is performed.

In flow tank 206, if the operation time is long, solder accommodated in body 270 may deteriorate. In addition, inside of body 270 may need to be cleaned and flow tank 206 may be needed to be removed from the electronic component mounting device. As described above, if flow tank 206 needs to be removed, maintenance execution condition B is established. After loading of boards and component mounting are stopped, and heater 352 is moved to the standby position, flow tank 206 is moved to sub-module 12. Maintenance execution condition B is a condition that is established if flow tank 206 needs to be removed and, for example, can be a condition that is established if the operation time is equal to or greater than a set time, and so on, or can be a condition that is established by determining that cleaning is needed by visual observation of an operator and operating manual operation section 412.

As illustrated in FIG. 11(*b*), hook 262 is rotated to the engaging release position by rotation-operating lever 260 and thereby flow tank 206 is in a released state in which removal is possible. In addition, necessary cables and the like are removed as appropriate. In this state, board S and component insertion device 22 are not present above flow tank 206. Thus, flow tank 206 can be moved in the z direction and removed while the orientation is held (while held horizontally).

If flow tank 206 were to be removed in main module 10, since component insertion device 22 is present above flow tank 206, removing work would be difficult, for example, because flow tank 206 would be moved from below guides 30 and 32 in the y direction. Moreover, since the weight of flow tank 206 is large, the removing work is further difficult when flow tank 206 is hot.

On the other hand, if work is performed in sub-module 12, since component insertion device 22 is not present, it is possible to perform removing work easily and safely. Note that, if flow tank 206 is hot, it is preferable that removing is performed by using a jig or the like.

As described above, in the embodiment, the maintenance region can be determined based on the maintenance position of flow tank 206 and the like. Both the maintenance region and the heating region are provided in sub-module 12, and the heating region and the maintenance region include a region in which they overlap. In addition, sub-module 12 selectively uses the heating region and the maintenance region without using both simultaneously. As a result, it is possible to reduce the size of the electronic component mounting device and to achieve space-saving compared to a case where the heating region and the maintenance region are individually provided.

In addition, in the embodiment, the component mountable region is provided in main module 10 and the component mountable region can be the same region as the component mounting region or can be a region wider than the component mounting region. The component mountable region can be, for example, the movable region of component insertion head 160*a* or a region between portal frames 44*c* and *d*, or a region determined by the structure of main module 10. The region outside the component mountable region may be a region adjacent to the component mountable region, a region separated from the component mountable region, a region outside the component mountable region in the conveying direction (x) of the board, or a region outside the component mountable region in a direction intersecting the conveying direction of the board. Furthermore, the region outside the component mountable region may be a region in which component insertion device 22 is not provided above board conveyance device 20, or a region outside board holding device 40, and the like. Similarly, the region outside the component mountable region may be a region that is determined by the structure of main module 10 and sub-module 12 or a region that is determined by the size of board S.

Note that, z-axis moving device 214 of the flow tank is not essential. There are cases where the same process can be performed by the control of jet motor 272.

It is also possible to provide a device for melting solder such as a laser irradiation device instead of flow tank 206. The present disclosure can be applied to the mounting machine described in PTL 4, whereby an electronic component is mounted by melting solder applied to the board S in advance by a heating source such as a laser irradiation device.

It is also possible to provide a cut and clinch device instead of flow tank 206. In this embodiment, the cut and clinch device is movable in three directions orthogonal to each other.

In addition, in in-conveyor device 36 and out-conveyor device 38, it is possible to use a belt instead of the chain.

Furthermore, it is not essential that heater 352 is movable in a direction intersecting the conveying direction of board S and, for example, it is acceptable if heater 352 is moved to a region in which heater 352 is allowed to be moved to the maintenance region of flow tank 206 such as the upstream side from sub-module 12.

In addition, it is not essential to use sub-module 12 for both the maintenance region and the heating region and sub-module 12 may be used for one of the maintenance region and the heating region. For example, heating may be performed on the upstream side from sub-module 12 and sub-module 12 can be used for maintenance of flow tank 206 and standby of board S. In this case, the heater moving device is not essential.

Furthermore, the maintenance region can be provided in a position outside the conveyance region of the board.

In addition, flow tank maintenance device 26 can also be considered not to correspond to the configuration elements of sub-module 12. For example, the inspection unit and solder replenishment machine can also be portable.

Furthermore, provision of the maintenance region is not essential. It is possible to reduce the size of the component mounting device compared to a case where board S is movable in the x, y, and z directions by making each of flow tank 206 and component insertion head 160*a* movable in the x, y, and z directions.

Embodiment 2

In the electronic component mounting device according to embodiment 1, one nozzle is provided in flow tank 206, but two or more nozzles may be provided in the flow tank such that solder can be selectively ejected.

Figure 17A:
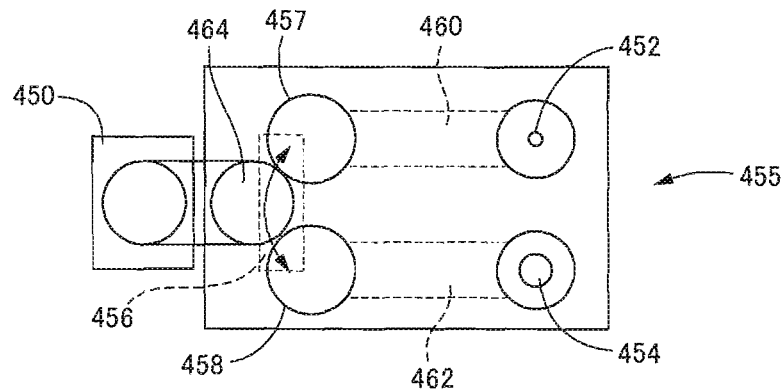
FIGS. 17A to 17C illustrate various embodiments of a nozzle switching mechanism.
Figure 17B:
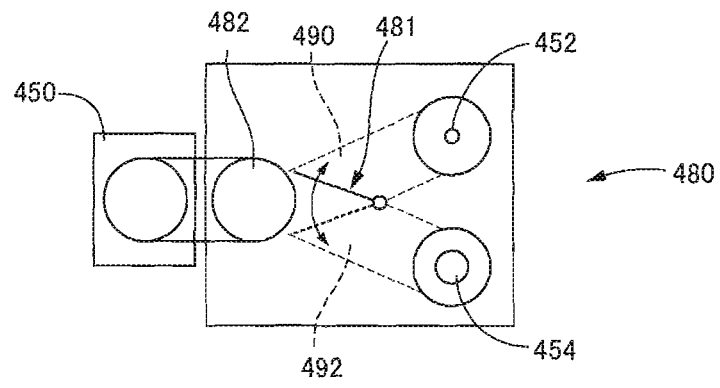
Figure 17C:
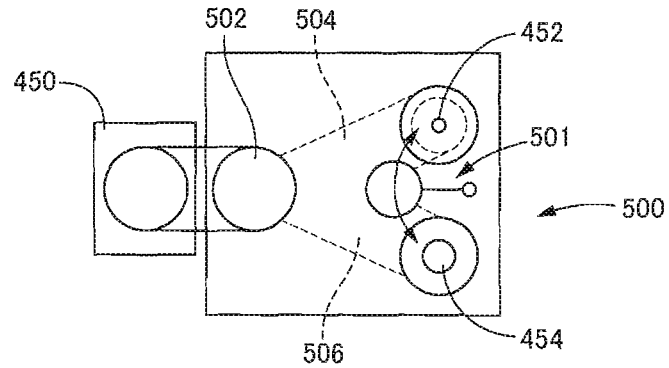

The shape of the components inserted into one board S, the shape of the leads, and the like are not limited to being the same. Thus, it is preferable that the applied solder amount is changed in accordance with the shape of those components, the shape of the leads, and the like. However, if multiple nozzles with diameters different from each other are provided in one flow tank, the jet heights from the nozzles are not the same as each other and solder cannot be applied stably to board S. On the other hand, if the applied solder amount is increased while using a nozzle with a small diameter, another problem arises in that the work time is increased. In addition, a flow tank can also be provided for each nozzle, but if the number of flow tanks is increased, man-hours are increased and another moving device is required. To counter these issues, in the embodiment, multiple nozzles with different diameters are provided in one flow tank separated from each other and solder is selectively ejected from one of the multiple nozzles. Examples of this are illustrated in FIGS. 17(*a*) to 17(*c*). The flow tanks illustrated in FIGS. 17(*a*) to 17(*c*) commonly include jet motor 450 and two nozzles 452 and 454 with opening areas different from each other, while the nozzle switching mechanisms for switching the nozzle from which solder is jetted are different. Hereinafter, the nozzle switching mechanism in each of FIGS. 17(*a*) to 17(*c*) will be described briefly.

Flow tank 455 illustrated in FIG. 17(*a*) includes propeller shaft switching mechanism 456 as the nozzle switching mechanism; propeller shaft switching mechanism 456 has two pumps and selectively transmits the driving force of jet motor 450 to one of the two pumps. The flow tank 455 includes (i) propeller shafts 457 and 458 that are connected to each screw of the two pumps, (ii) paths 460 and 462 that respectively connect each of the two pumps and nozzles 452 and 454, and (iii) drive transmitting shaft 464 that is rotated in accordance with rotation of an output shaft of jet motor 450; clutch mechanism of propeller shaft switching mechanism 456 is provided between drive transmitting shaft 464 and two propeller shafts 457 and 458. Clutch mechanism 456 can also be, for example, a mechanism of switching the mating state of a gear section provided in each of drive transmitting shaft 464, and propeller shafts 457 and 458.

Flow tank 480 illustrated in FIG. 17(*b*) includes path switching mechanism 481 as a nozzle switching mechanism that blocks one path that connects one pump and each of the nozzles 452 and 454 and connects the other path. Path switching mechanism 481 can be referred to as a direction switching mechanism that changes the flow path of the jet generated by driving of a screw. Flow tank 480 includes screw type propeller shaft 482 that is rotated in accordance with the rotation of jet motor 450 and jet paths 490 and 492 respectively provided between a screw of the pump and the nozzles 452 and 454, and the path switching mechanism 481 is provided between the jet paths 490 and 492. Path switching mechanism 481 is, for example, a direction switching valve and may include a shutter member, a rotation device that rotates the shutter member, and the like.

Flow tank 500 illustrated in FIG. 17(*c*) includes nozzle switching mechanism 501 that blocks one of the two nozzles 452 and 454 and opens the other. Flow tank 500 includes (a) a screw type propeller shaft 502 of a pump (not illustrated) that is rotated in accordance with rotation of jet motor 450 and (b) jet paths 504 and 506 that are respectively provided between the screw and nozzles 452 and 454; nozzle switching mechanism 501 is provided between the two nozzles 452 and 454. Nozzle switching mechanism 501 may include a shutter member and a rotating device that rotates the shutter member, and may be provided inside flow tank 500, or may be provided on the outside of the flow tank 500; if nozzle switching mechanism 501 is provided on the outside, nozzle switching mechanism 501 can be switched by a manual operation of an operator. In addition, simply, a nozzle that is not used can be blocked by clamp, a cap, or the like by an operator.

As described above, in flow tanks 455, 480, and 500 of FIGS. 17(*a*) to 17(*c*), since nozzles with opening areas different from each other can be selectively used, it is possible to apply solder at different spot diameters using one flow tank. Thus, it is possible to shorten component mounting time, to achieve space-saving, and to reduce the cost. Moreover, the flow tank according to embodiment 2 can be used as a flow tank of an electronic component mounting device that does not include sub-module 12.

Embodiment 3

Figure 18:
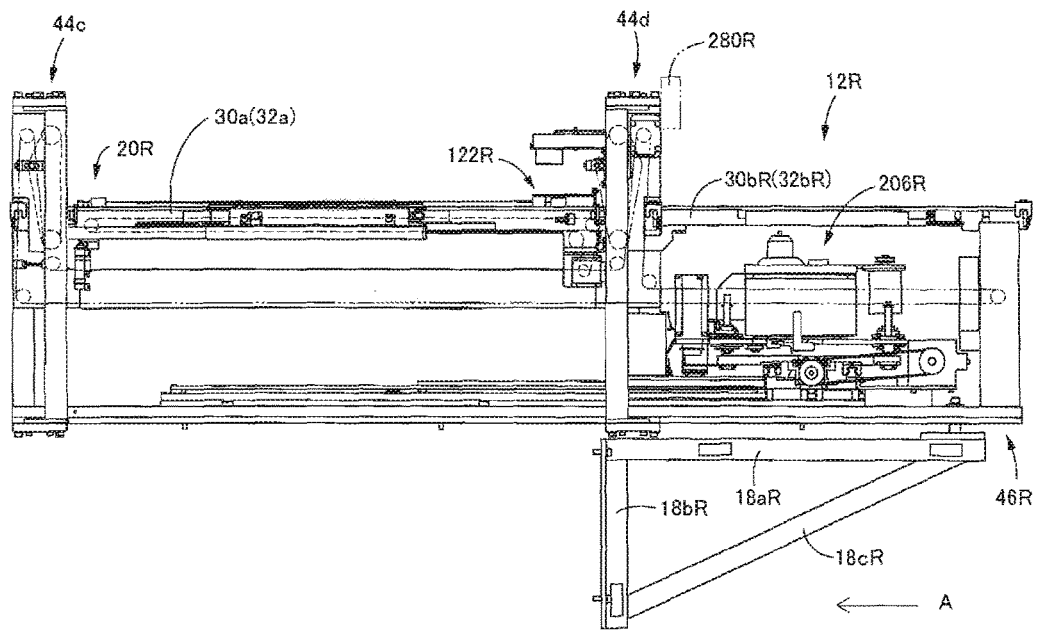
FIG. 18 is a front view of a flow tank moving device and the like of an electronic component mounting device according to embodiment 3 of the disclosure.
Figure 19:
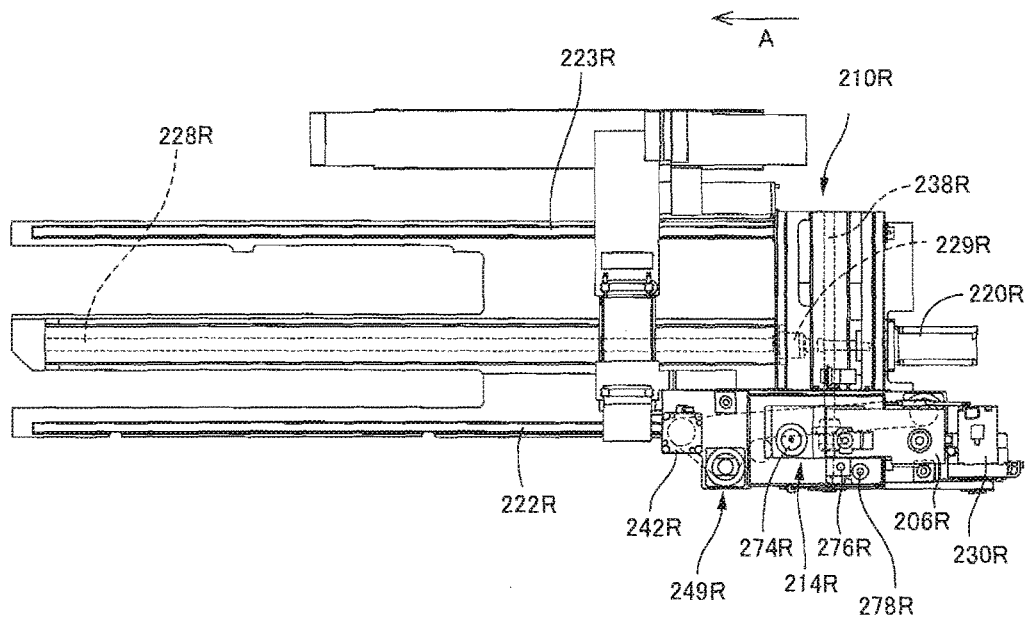
FIG. 19 is a plan view of the flow tank moving device of the above electronic component mounting device.

In the electronic component mounting device of embodiment 1, sub-module 12 is connected to main module 10 on the left side when viewed in the front, but it can be connected on the right side and an example of a main portion of the electronic component mounting device in this case is illustrated in FIGS. 18 and 19. In the electronic component mounting device of this embodiment, the conveying direction of the board is the direction of arrow F and is opposite to the case of the electronic component mounting device of embodiment 1. As described above, portal frames 44*c* and *d* are provided on both sides of main module 10 in the x direction, screw rods 78*c* and *d*, and drive transmitting rods 94 and 104 are provided above guides 30 and 32 extending in the y direction; thus, whichever side of the main module 10 sub-module 12 is connected to, moving of flow tank 206 is allowed between main module 10 and sub-module 12.

Note that, when comparing to the electronic component mounting device of embodiment 1, basic configuration elements are the same. Thus, in the example, symbol R is given to members corresponding to the configuration elements described in embodiment 1 and detailed description is omitted.

As illustrated in FIGS. 18 and 19, (a) flow tank 206R has the same structure as flow tank 206 of the electronic component mounting device of embodiment 1 (hereinafter, simply referred to as flow tank 206 of embodiment 1; the same applies for other members), but is provided with the orientation changed (rotated by 180°).

(b) X-axis moving device 210R of flow tank 206R has the same structure as that of x-axis moving device 210 of embodiment 1, but is provided with the orientation changed (rotated by 180°). Configuration elements of y-axis moving device 212R and z-axis moving device 214R are the same as the configuration elements of y-axis moving device 212 and z-axis moving device 214 of embodiment 1, and arrangement of the configuration elements is symmetrical with respect to the y axis.

(c) In board conveyance device 20R, portal frame 44*c* is positioned on the unloading side, portal frame 44*d* is positioned on the loading side, and groove-shaped frame 46 is provided on the upstream side of portal frame 44*d*. Basic configuration elements and arrangement between the two portal frames 44*c* and 46*d* are the same as those of board conveyance device 20 of embodiment 1, and shuttle 122R has a shape that is symmetrical to shuttle 122 of embodiment 1 with respect to the y axis. Also, guides 30*b*R and 32*b*R are respectively connected to fixed frame 54*d* and movable frame 56*d* of portal frame 44*d*, thus extending guides 30*a* and 32*a*. Note that, sub-module 12R is connected to main module 10 on the right side and thereby replacement of pulleys, changeover of chains and belts is appropriately performed in the width switching device, in-conveyor device, and out-conveyor device.

(d) Inspection unit 280R is provided in portal frame 44*d*.

As described above, it is possible to freely determine a relative position (conveying direction of the board) between main module 10 and sub-module 12 depending on user requirements (for example, installation space in a plant). In addition, in embodiment 1 and embodiment 3, since many configuration elements are the same, it is possible to match the needs of the user while suppressing cost increases.

Embodiment 4

Figure 20:
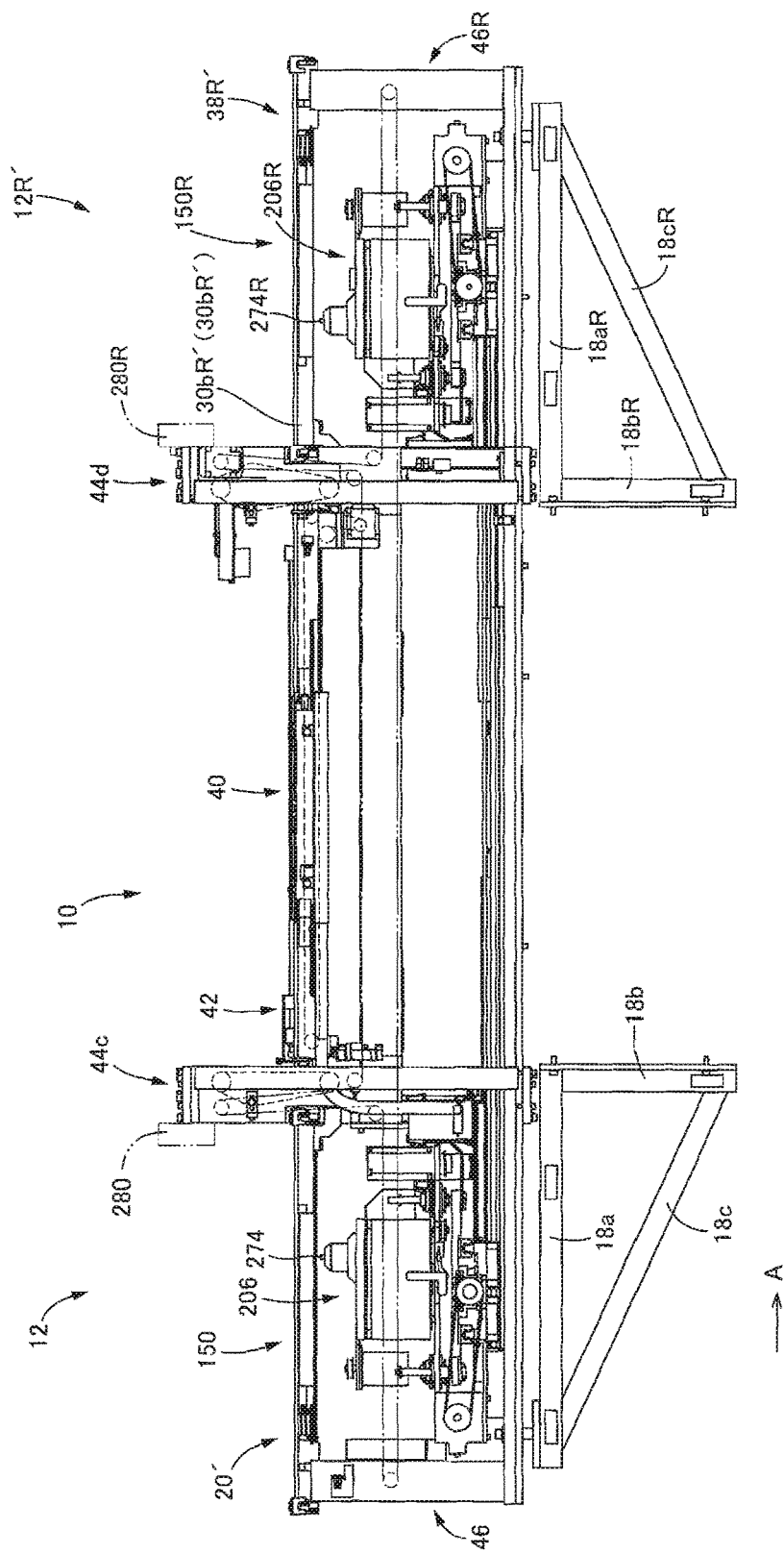
FIG. 20 is a front view of a flow tank moving device and the like of an electronic component mounting device according to embodiment 4 of the disclosure.
Figure 21:
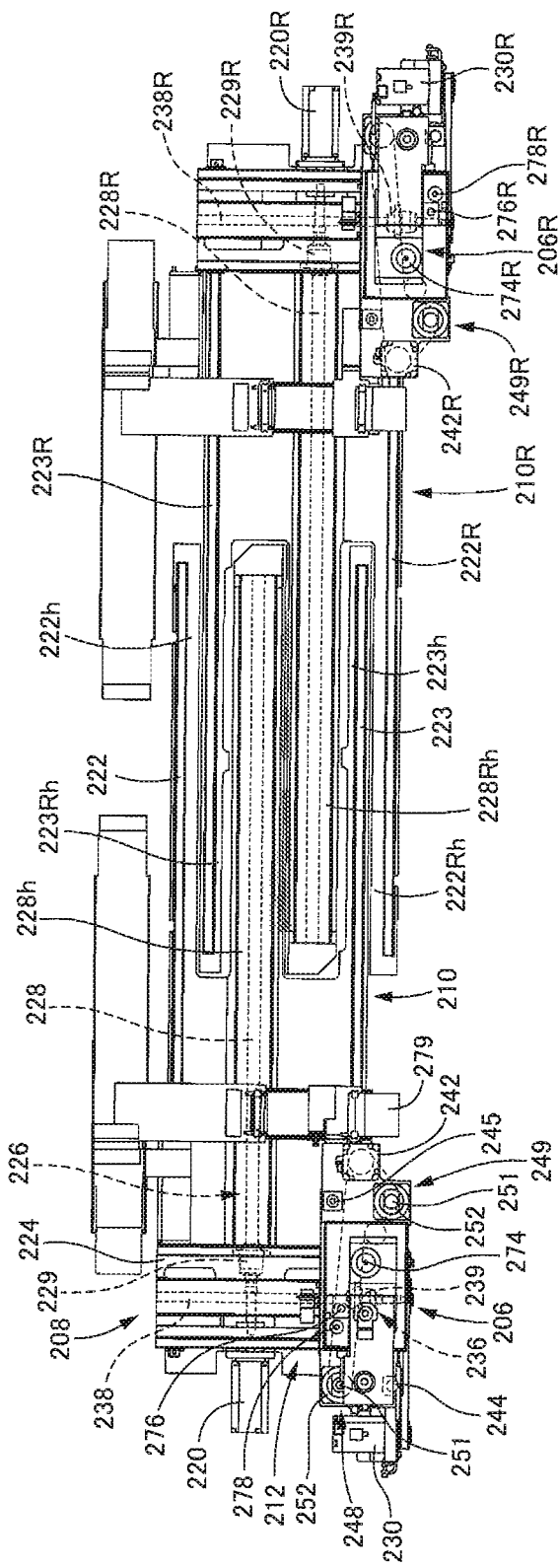
FIG. 21 is a plan view of the flow tank moving device of the above electronic component mounting device.

In the electronic component mounting device of embodiment 4, as illustrated in FIGS. 20 and 21, sub-modules 12 are connected to main module 10 on both sides in the x direction. The electronic component mounting device of the embodiment is configured by combining sub-module 12R of embodiment 3 to the electronic component mounting device of embodiment 1 and the configuration elements are basically the same as the above embodiments. Hereinafter, symbol "R" or "'" is given to members corresponding to the configuration elements described in the electronic component mounting device of embodiments 1 and 3, and detailed description is omitted.

Note that, in the electronic component mounting device of this embodiment, the conveying direction of the board may be the direction of arrow A or the direction of arrow F, or may be adapted to the needs of the user; in this case, the conveying direction is the direction of arrow A.

(i) In the electronic component mounting device of this embodiment, two flow tanks 206 and 206R are provided. Flow tanks 206 and 206R have the same structure as flow tanks 206 and 206R of embodiments 1 and 3, but the opening area of nozzle 274 of flow tank 206 is different from the opening area of nozzle 274R of flow tank 206R. In addition, x-axis moving devices 210 and 210R are respectively provided corresponding to flow tanks 206 and 206R, and are arranged in a state where each of guides and rods thereof are alternatively positioned. Specifically, guide body 222*h*R and screw rod body 228*h*R of x-axis moving device 210R are respectively disposed in a state positioned in gap h1 between guide body 222*h* and screw rod body 228*h* of x-axis moving device 210, and in gap h2 between screw rod body 228*h* and guide body 223*h*.

(ii) In board conveyance device 20', guides 30*b*R' and 32*b*R' are connected to fixed frame 54*d* and movable frame 55*d* of portal frame 44*d*, thus extending guides 30 and 32. In addition, the conveying distance of out-conveyor device 38R' is increased.

(iii) Similar to the case of embodiment 3, replacement and addition of pulleys, and changeover of chains and belts are appropriately performed in each of the width switching device, in-conveyor device, and out-conveyor device.

(iv) Furthermore, since the conveying direction of board S is direction A, heating device 28 is included in sub-module 12 on the left side, but a heating device is not included in sub-module 12R' on the right side. However, since two flow tanks 206 and 206R are provided, inspection unit 280R is also provided in portal frame 44*d*. Inspection units 280 and 280R are provided to correspond to flow tanks 206 and 206R one-to-one.

In the electronic component mounting device of this embodiment, operation in a case where component mounting is performed will be described simply.

Flow tank 206 is positioned in a component mounting region (within main module 10) and flow tank 206R is positioned within sub-module 12R'.

(1) Board S is moved to main module 10 after being heated by heater 352 in the heating position of sub-module 12 and is held by board holding device 40.

(2) Solder is applied to the solder applying target point by flow tank 206 and then flow tank 206 is moved to sub-module 12 on the upstream side. In this case, heater 352 is returned to the standby position.

(3) Flow tank 206R on the downstream side is moved to the component mounting region of main module 10, solder is applied to another solder applying target point of the board, and a component is mounted.

(4) Thereafter, board S is carried out and flow tank 206R is moved to sub-module 12R'.

In the embodiment, a first moving device is configured of x-axis moving device 210 and a second moving device is configuration of x-axis moving device 210R.

As described above, in the electronic component mounting device of the embodiment, for board S held in board holding device 40, for each of the solder applying target points, it is possible to apply different solder amounts in one step. Thus, it is possible to reduce the man-hours and to improve working efficiency.

In addition, in the embodiment, since flow tank 206 is returned to sub-module 12 during component mounting of the board, heater 352 is moved to the standby position. However, since flow tank 206 is positioned below board S, it is possible to keep board S warm.

Furthermore, since maintenance regions are respectively provided corresponding to flow tanks 206 and 206R, it is possible to facilitate inspection of flow tanks 206 and 206R, replenishment of solder, and removing of solder.

In the embodiment, sub-module 12 is used as the heating region, the standby region and the maintenance region of flow tank 206; sub-module 12R' is used as the standby region and the maintenance region of flow tank 206R.

Moreover, heating device 28 can also be provided on the upstream side from sub-module 12 and, in this case, multiple boards can be in the standby state in sub-module 12. In this case, sub-module 12 is used as both the standby region and the maintenance region of the board.

In addition, the disclosure is not limited to component mounting and can be applied to cases where other work is performed, with various changes and improvements being possible based on knowledge of those of skilled in the art in addition to aspects of embodiments 1 to 4 as described above.

REFERENCE SIGNS LIST

10: main module, 12: sub-module, 20: board conveyance device, 22: component insertion device, 24: solder applying device, 26: maintenance device, 28: heating device, 30, 32: guide, 34: width changing device, 36: in-conveyor device, 38: out-conveyor device, 40: board holding device, 42: shuttle device, 44: portal frame, 46: groove-shaped frame, 90: chain, 100: chain, 110: rail, 122: shuttle, 150: board moving suppression section, 160a: component insertion head, 162: detection head, 170: x-axis moving device, 171: y-axis moving device, 172, 173: z-axis moving device, 206: flow tank, 208: flow tank moving device, 210: x-axis moving device, 212: y-axis moving device, 214: z-axis moving device, 258: mounting and dismounting device, 280: maintenance device, 282: solder replenishment device, 352: heater, 354: heater moving device

The invention claimed is:

1. An electronic component mounting device comprising:
an electronic component insertion device that inserts an electronic component into a board from one side of the board within a component mountable region that is set in advance; and
a viscous fluid applying device that applies a viscous fluid to the board from the other side of the board in parallel with insertion of the electronic component into the board by the electronic component insertion device,
wherein the viscous fluid applying device includes (a) at least one flow tank that accommodates the viscous fluid and ejects the viscous fluid, and (b) a flow tank moving device that moves each of the at least one flow tanks to not only the component mountable region, but also a region outside the component mountable region,
wherein the region outside the component mountable region includes a maintenance region in which at least one maintenance operation is performed on at least one of the flow tanks,
wherein the electronic component mounting device includes a maintenance device that performs maintenance of the flow tank which is an object of maintenance from the least one flow tank, and
wherein the maintenance device includes (a) an inspection unit that performs inspection of the flow tank that is the object of maintenance and (b) an inspection unit moving device that is able to move the inspection unit between the standby position and an inspection position at which inspection of the flow tank, which is in the maintenance region and is the object of maintenance, is able to be performed.

2. An electronic component mounting device comprising:
an electronic component insertion device that inserts an electronic component into a board from one side of the board within a component mountable region that is set in advance; and
a viscous fluid applying device that applies a viscous fluid to the board from the other side of the board in parallel with insertion of the electronic component into the board by the electronic component insertion device,
wherein the viscous fluid applying device includes (a) at least one flow tank that accommodates the viscous fluid and ejects the viscous fluid, and (b) a flow tank moving device that moves each of the at least one flow tanks to not only the component mountable region, but also a region outside the component mountable region,
wherein the region outside the component mountable region includes an upstream side region of the component mountable region in a conveying direction of the board, and
wherein the electronic component mounting device includes a heating device that has (a) a heater and (b) a heater moving device that moves the heater between a heating position in which the board of the upstream side region is heated and a standby position outside the upstream side region in a direction intersecting the conveying direction of the board.

3. The electronic component mounting device according to claim 1,
wherein the region outside the component mountable region includes at least one of an upstream side region and a downstream side region of the component mountable region in a conveying direction of the board.

4. The electronic component mounting device according to claim 2,
wherein the region outside the component mountable region includes a maintenance region in which at least one maintenance operation is performed on at least one of the flow tanks.

5. The electronic component mounting device according to claim 2,
wherein the upstream side region of the component mountable region includes a maintenance region in which at least one maintenance operation is performed on at least one of the flow tanks, and
wherein the flow tank moving device includes a maintenance-time flow tank moving control section that, in a case in which a maintenance execution condition is established and the heater is in the standby position, moves a flow tank which is an object of maintenance from the at least one flow tank to the maintenance region.

6. An electronic component mounting device comprising:
an electronic component insertion device that inserts an electronic component into a board from one side of the board within a component mountable region that is set in advance; and
a viscous fluid applying device that applies a viscous fluid to the board from the other side of the board in parallel with insertion of the electronic component into the board by the electronic component insertion device,
wherein the viscous fluid applying device includes (a) at least one flow tank that accommodates the viscous fluid and ejects the viscous fluid, and (b) a flow tank moving device that moves each of the at least one flow tanks to not only the component mountable region, but also a region outside the component mountable region,
wherein the region outside the component mountable region includes an upstream side region and a downstream side region of the component mountable region in a conveying direction of the board,
wherein the viscous fluid applying device includes two flow tanks, and
wherein the flow tank moving device includes (a) a first moving device that moves one of the two flow tanks between the component mountable region and the upstream side region, and (b) a second moving device that moves the other one of the two flow tanks between the component mountable region and the downstream side region.

7. The electronic component mounting device according to claim 1,
wherein the viscous fluid applying device includes two flow tanks,
wherein the two flow tanks respectively include at least one nozzle that ejects the viscous fluid, and
wherein at least one of an opening area of at least one of the nozzles provided on one of the two flow tanks, and at least one of an opening area of at least one of the nozzles provided on the other flow tank, are different from each other.

8. The electronic component mounting device according to claim 1,
wherein at least one of the flow tanks includes multiple nozzles and selectively ejects the viscous fluid from one of the multiple nozzles.

9. The electronic component mounting device according to claim 1,
wherein the electronic component insertion device includes (a) an electronic component insertion head that holds the electronic component and inserts the electronic component into the board, and (b) an electronic component insertion head moving device that moves the electronic component insertion head, and
wherein the component mountable region includes a region in which the electronic component insertion head is able to be moved by the electronic component insertion head moving device.

10. An electronic component mounting device comprising:
a board holding device that holds a board;
an electronic component insertion head that inserts an electronic component into the board from one side of the board that is held by the board holding device;
at least one flow tank that accommodates a viscous fluid and applies the viscous fluid to the board from the other side of the board that is held by the board holding device; and
a flow tank three-dimensional moving device that is able to move each of the at least one flow tanks in three directions orthogonal to each other,
wherein each of the at least one flow tank includes a viscous fluid ejection section that applies the viscous fluid to the board by ejecting the viscous fluid from below the board that is held in the board holding device,
wherein the electronic component mounting device includes a height acquisition section that acquires a height from the flow tank that is scheduled to eject the viscous fluid to the board, to a portion of the board to which the viscous fluid is scheduled to be applied, and
wherein the flow tank three-dimensional moving device includes a height control section that controls the height of the flow tank that is scheduled to eject the viscous fluid, based on the height acquired by the height acquisition section.

* * * * *